(12) United States Patent
Peng et al.

(10) Patent No.: US 12,467,134 B2
(45) Date of Patent: Nov. 11, 2025

(54) METHOD FOR DEPOSITION OF GALLIUM-CONTAINING FILM WITH GALLIUM PRECURSORS

(71) Applicants: L'Air Liquide, Societe Anonyme pour l'Etude et l'Exploitation des Procedes Georges Claude, Paris (FR); Air Liquide Electronics U.S. LP, Dallas, TX (US)

(72) Inventors: Bo Peng, Fremont, CA (US); Julien Gatineau, Jouy-en-Josas (FR); Ziyun Wang, Dallas, TX (US); Yumin Liu, Fremont, CA (US)

(73) Assignees: L'Air Liquide, Societe Anonyme pour l'Etude et l'Exploitation des Procedés Georges Claude, Paris (FR); American Air Liquide, Inc., Fremont, CA (US)

( * ) Notice: Subject to any disclaimer, the term of this patent is extended or adjusted under 35 U.S.C. 154(b) by 28 days.

(21) Appl. No.: 18/570,260

(22) PCT Filed: Jun. 17, 2022

(86) PCT No.: PCT/US2022/034003
§ 371 (c)(1),
(2) Date: Dec. 14, 2023

(87) PCT Pub. No.: WO2022/266449
PCT Pub. Date: Dec. 22, 2022

(65) Prior Publication Data
US 2024/0287675 A1    Aug. 29, 2024

Related U.S. Application Data

(60) Provisional application No. 63/212,184, filed on Jun. 18, 2021.

(51) Int. Cl.
*C23C 16/40* (2006.01)
*C23C 16/455* (2006.01)

(52) U.S. Cl.
CPC ........ *C23C 16/40* (2013.01); *C23C 16/45531* (2013.01); *C23C 16/45553* (2013.01)

(58) Field of Classification Search
CPC .............. C23C 16/40; C23C 16/45531; C23C 16/45553
See application file for complete search history.

(56) References Cited

U.S. PATENT DOCUMENTS

| | | | | |
|---|---|---|---|---|
| 5,474,851 | A * | 12/1995 | Ganswein | C03C 17/245 428/432 |
| 7,972,974 | B2 * | 7/2011 | Ahn | H01L 21/31604 427/255.28 |
| 9,171,960 | B2 * | 10/2015 | Hong | H10D 30/0321 |
| 2004/0122248 | A1 * | 6/2004 | Shenai-Khatkhate | C07F 5/00 556/7 |
| 2005/0202170 | A1 * | 9/2005 | Remington | C03C 17/002 427/248.1 |
| 2007/0158765 | A1 * | 7/2007 | Ahn | H10D 64/685 438/785 |
| 2011/0237025 | A1 * | 9/2011 | Yamazaki | H10D 30/6704 438/104 |
| 2014/0027764 | A1 * | 1/2014 | Yamazaki | H10D 87/00 257/43 |
| 2014/0210835 | A1 * | 7/2014 | Hong | H10D 84/038 345/530 |
| 2016/0149005 | A1 * | 5/2016 | Oda | C30B 25/183 117/88 |
| 2016/0268121 | A1 * | 9/2016 | Gordon | H10D 1/68 |
| 2019/0203357 | A1 * | 7/2019 | Mizutani | C23C 16/45553 |
| 2021/0118672 | A1 * | 4/2021 | Madia | H01L 21/0262 |
| 2022/0228293 | A1 * | 7/2022 | Rafie Borujeny | C23C 16/45542 |
| 2023/0167548 | A1 * | 6/2023 | Hock | H01L 21/02205 438/778 |

FOREIGN PATENT DOCUMENTS

| | | | | |
|---|---|---|---|---|
| CN | 1930099 | B * | 8/2011 | ............. C03C 17/00 |
| EP | 2540732 | A1 * | 6/2011 | ................ C07F 5/00 |
| EP | 2 492 273 | | 8/2012 | |

(Continued)

OTHER PUBLICATIONS

Battiston, G.A., et al., "Chemical vapour deposition and characterization of gallium oxide thin films". Thin Solid Films, vol. 279, Issues 1-2, Jun. 1996, pp. 115-118.*
Jubu, P.R., et al., "Deposition of Gallium Oxide Nanostructures at Low Substrate Temperature by Chemical Vapor Deposition". ECS Journal of Solid State Science and Technology, 2020 9 035006, pp. 1-6.*
Zhang, Yuxuan, et al., "High-temperature low-pressure chemical vapor deposition of β-Ga2O3". J. Vac. Sci. Technol. A 38 (5) Sep./Oct. 2020, 050806, pp. 1-10.*

(Continued)

*Primary Examiner* — Bret P Chen
(74) *Attorney, Agent, or Firm* — Yan Jiang

(57) ABSTRACT

A method of deposition of a gallium-containing oxide film on a substrate comprises a) simultaneously or sequentially, exposing the substrate to a vapor of a gallium precursor, additional metal precursor(s) and an oxidizer; b) depositing at least part of the gallium precursor and at least part of the additional metal precursor(s) onto the substrate to form the gallium-containing oxide film on the substrate through a vapor deposition process, wherein the gallium precursor has the formula:

$$(NR^8R^9)(NR^1R^2)Ga[(R^3R^4N)C_x(R^5R^6)(NR^7)] \quad (I)$$

$$(Cy-N)_2Ga[(R^3R^4N)C_x(R^5R^6)(NR^7)] \quad (II)$$

wherein, $R^1$ to $R^9$ are independently selected from H, Me, Et, nPr, iPr, nBu, iBu, sBu, or tBu; $R^1$ to $R^9$ may be the same or different; x=2, 3, 4, preferably x=2; Cy-N refers to saturated N-containing rings or unsaturated N-containing rings.

20 Claims, 2 Drawing Sheets

(56) References Cited

FOREIGN PATENT DOCUMENTS

| JP | 2014-209538 A | * 11/2014 | ............. H01L 31/10 |
|---|---|---|---|
| JP | 2020 009 960 | 1/2020 | |
| JP | 2020-105038 A | * 7/2020 | ............. C30B 29/16 |
| KR | 10-2013-0140372 | * 12/2013 | ........... H01L 21/205 |
| WO | WO 2020 179748 | 9/2020 | |

OTHER PUBLICATIONS

Jubu, P.R., et al., "Synthesis and characterization of gallium oxide in strong reducing growth ambient by chemical vapor deposition". Materials Science in Semiconductor Processing 121 (2021) 105361 pp. 1-6.*

Berry, Sean T., et al., "Monomeric Chelated Amides of Aluminum and Gallium: Volatile, Miscible Liquid Precursors for CVD". Mat. Res. Soc. Symp. Proc. vol. 606, pp. 83-89.*

Valet, Murielle, et al., "Synthesis of Homoleptic Gallium Alkoxide Complexes and the Chemical Vapor Deposition of Gallium Oxide Films". Chem. Mater. 2001, 13, 2135-2143.*

PCT Search Report and written Opinion for PCT/US2022/034003, mailed Aug. 23, 2022.

Barry, et al., "Monomeric Chelated Amides of Aluminum and Gallium: Volatile, Miscible Liquid Precursors for CVD", Materials Research Society Symposium Proceedings, 2000, vol. 606, pp. 83-89.

Gordon, et al., "Optimization of Transparent and Reflective Electrodes for Amorphous Silicon Solar Cells," National Renewable Energy Laboratory, 1998, 37 pgs.

Illiberi, et al., "Spatial Atmospheric Atomic Layer Deposition of InxGayZnzO for Thin Film Transistors," ACS Appl. Mater. Interfaces 2015, 7, pp. 3671-3675.

Lee, et al., "ALD and MOCVD of Ga2O3 Thin Films Using the New Ga Precursor Dimethylgallium Isopropoxide, Me2GaOiPr," Chem. Vap. Deposition, 2011, 17, pp. 191-197.

Lee, et al., "Dimethylgallium Isopropoxide as a New Volatile Source for ALD and MOCVD of Ga2O3," ECS Transactions, 25 (8), pp. 587-592, 2009.

Maeng, et al., "Growth characteristics and film properties of gallium doped zinc oxide prepared by atomic layer deposition," J Electroceram (2013) 31:338-344.

Sheng, et al. "Atomic Layer Deposition of an Indium Gallium Oxide Thin Film for Thin-Film Transistor Applications," (ACS Appl. Mater. Interfaces, 2017, 9, pp. 23934-23940.

Seong, et al., "Electrical characteristics of Ga2O3—TiO2 nanomixed films grown by plasma-enhanced atomic-layer deposition for gate dielectric applications," Applied Physics Letters, 87, 082909 (2005).

* cited by examiner

METHOD FOR DEPOSITION OF GALLIUM-CONTAINING FILM WITH GALLIUM PRECURSORS

CROSS-REFERENCE TO RELATED APPLICATIONS

This application is a § 371 of International PCT Application PCT/US2022/034003, filed Jun. 17, 2022, which claims the benefit of priority under 35 U.S.C. § 119 (a) and (b) to U.S. Provisional Patent Application No. 63/212,184, filed Jun. 18, 2021.

FIELD OF THE INVENTION

The present invention relates to gallium precursors for deposition of gallium-containing oxide films, such as, binary, ternary or quaternary gallium-containing oxide films. In particular, the gallium precursors are liquid, volatile, non-pyrophoric, halide-free molecules.

BACKGROUND

Usage of gallium oxide ($Ga_2O_3$) is of interest for several applications in microdevices and as such the development of cost-effective, safe, gallium molecules that can be used to deposit thin films in Chemical Vapor Deposition (CVD) or Atomic Layer Deposition (ALD), or any gas phase growth method, is of interest. Applications of interest are: gas sensors, transparent conducting oxides (TCOs), photocatalytic materials, oxide semiconductors, etc.

Indium gallium zinc oxide (IGZO) is a semiconducting material, consisting of indium (In), gallium (Ga), zinc (Zn) and oxygen (O). IGZO thin-film transistors (TFT) are used in the optoelectronic devices due to their higher electron mobility. Such optoelectronic devices require very well defined, homogeneous thin film layers to better control their performances and optimize their size. IGZO's advantage is that it can be deposited as a uniform amorphous phase while retaining the high carrier mobility common to oxide semiconductors. IGZO is also considered to be used in next generation semiconductor devices, whether for memory application or logic application (n-type BEOL transistor).

The current impediment to large-scale IGZO manufacturing is the synthesis method. The most widely used technique for Transparent Conducting Oxide (TCO) synthesis is Pulsed Laser Deposition (PLD). In PLD, a laser is used to focus on nano-sized spots on solid elemental targets. Laser pulse frequencies are varied between the targets in ratios to control the composition of the film. IGZO can be deposited onto substrates such as quartz, single-crystal silicon, or even plastic due to its ability for low-temperature deposition. The substrates are placed in a PLD vacuum chamber, which controls oxygen pressure in order to ensure favorable electrical properties. After synthesis, the film is annealed, or gradually exposed to air to adjust to the atmosphere.

While PLD is a useful and versatile synthesis technique, it requires expensive equipment and plenty of time for each sample to adjust to regular atmospheric conditions. This is not ideal for industrial manufacturing.

Solution Processing is a more cost effective alternative. Specifically, combustion synthesis techniques can be used. Metal nitrate solution with an oxidizer to create an exothermic reaction is one example. One common type of combustion synthesis is spin coating, which involves depositing In and Ga solution layers onto a hot plate and annealing at temperatures roughly between 200 and 400° C., depending on the target composition. The films can be annealed in air, which is a large advantage over PLD. Combustion processing has potential as a new synthesis method, but more research is required to assess its viability.

Such optoelectronic devices require very well defined, homogeneous thin film layers to better control their performances and optimize their size. The conventional film formation methods, such as chemical vapor deposition (CVD), Atomic Layer Deposition (ALD), or plasma-enhanced atomic layer deposition (PEALD) can make the thin films with desired properties. A key parameter for industrial applications is to develop liquid gallium-containing precursors because it is more practical, and as such cost effective, to fill in a storing canister, to deliver into a reactor through feeding lines and exhaust lines. The use of a solid precursor requires a sublimator for vapor formation and this raises several issues. First the fill amount in the canister (sublimator) will be limited to a few hundred grams, and the sublimator cannot be refilled while on the tool, so it typically needs to be replaced often. Second, solid precursors very often have low vapor pressure, leading to fluctuating feed rates. In addition, some variation in grain sizes may lead to differences in the evaporation of the product. Finally, for safety reasons, the gallium-containing precursors would preferably not be spontaneously flammable upon air exposure (pyrophoric).

RELATED ART

For example, a non-pyrophoric liquid type Ga precursor, trimethyl [N-(2-methoxyethyl)-2-methylpropan-2-amine] gallium, $GaMe_3 \cdot (CH_3OCH_2CH_2NH^tBu)$ was developed and applied in ALD $GaO_x$ application. $GaO_x$ thin film can be deposited in a temperature range of 100° C. and 250° C. with a growth rate of 1.0 Å/cycle (Ceramics International, Volume 47, Issue 2, 15 Jan. 2021, Pages 1588-1593).

Another example of non-pyrophoric liquid gallium precursor is Dimethyl gallium isopropoxide, $Me_2Ga(OiPr)$. It is a liquid at room temperature and has a reasonably high vapor pressure (0.55 Torr/25° C.; 0.75 Torr/30° C.; 1.0 Torr/35° C.; 1.3 Torr/40° C.), high enough for atomic layer deposition and/or metal organic chemical vapor deposition. In the ALD process, when water is used as the oxygen source, an apparent ALD temperature window between 300 and 325° C. with a growth rate of ~1.5 Å/cycle is achieved. The MOCVD is performed in the temperature range 450-625° C. with oxygen as the reacting gas. The $Ga_2O_3$ films deposited in both processes were found to be stoichiometric and amorphous. Using this precursor, conductive Ga doped ZnO thin film can be successfully deposited. The electrical, structural and optical properties are systematically investigated as functions of the Ga doping contents and deposition temperature. The best carrier concentration and transmittance ($7.2 \times 10^{20}$ $cm^{-3}$ and 83.5%) with low resistivity (~3.5× $10^{-3}$ (cm)) are observed at 5 at. % Ga doping concentration deposited at 250° C. (ECS Transactions, 25 (8), 587-592, 2009 and Chem. Vap. Deposition, 17, 191-197, 2011). The problem with alkoxy-containing molecules is that their ALD behavior is often limited to very small aspect ratio structure and to solve this issue amine-containing molecules are often preferred.

Deposition of indium gallium oxide, indium gallium zinc oxide thin films by CVD and ALD methods have been reported. For example, paper "Atomic Layer Deposition of an Indium Gallium Oxide Thin Film for Thin-Film Transistor Applications" (Appl. Mater. Interfaces, 2017, 9, 23934-23940) studied the deposition of indium gallium oxide (IGO) thin films via atomic layer deposition (ALD) using [1,1,1-trimethyl-N-(trimethylsilyl)-silanaminato]indium (InCA-1) and trimethylgallium (TMGa) as indium and gallium precursors respectively.

Gallium doped zinc oxide was reported in paper "Growth characteristics and film properties of gallium doped zinc oxide prepared by atomic layer deposition" (J Electroceram (2013) 31:338-344). Gallium(III) isopropoxide and diethylzinc were used as the precursors in the study.

Study on the nucleation and growth of InGaZnO thin films by spatial atmospheric atomic layer deposition using diethyl zinc (DEZn), trimethyl indium (TMIn), triethyl gallium (TEGa) as Zn, In, Ga precursors was reported in paper "Spatial Atmospheric Atomic Layer Deposition of $In_xGa_yZn_zO$ for Thin Film Transistors" (ACS Appl. Mater. Interfaces 2015, 7, 6, 3671-3675).

In these studies, the Ga, Zn, and In precursors are mostly pyrophoric materials, which is what this invention tries to avoid and use the physical property of comparable materials.

Gallium complexes $(NMe_2)_2Ga(MeNCH_2CH_2NMe_2)$ and $(NMe_2)_2Ga(EtNCH_2CH_2NMe_2)$ are reported to be liquid and volatile (MRS proceedings, 1999 by S. T. Barry, et al). These molecules are reported to be thermally stable and can be vaporized leaving no residue (no TGA data). The molecules are not pyrophoric and thus are safer to handle. While the gallium molecules were not used to deposit films, their aluminum versions were used to deposition AlN in CVD mode with ammonia. Deposition of AlN from $(NMe_2)_2Al(EtNCH_2CH_2NMe_2)$ was reported at 200° C.

For the deposition of Gallium oxide containing films, the gallium-containing precursors should not contain halides that may degrade the electrical conductivity of the films resulting from its process. Furthermore, the gallium precursors should be compatible with indium and zinc co-precursors in the IGZO applications, such as close to similar volatility and comparable thermal stability, etc. Several studies on ALD of $Ga_2O_3$ thin films have been reported using precursors including trimethylgallium ($GaMe_3$), hexakis(dimethylamino)digallium [$(Ga_2(NMe_2)_6$] and $Ga(acac)_3$ (acac=pentane-2,4-dionate), etc. All of these precursors are either pyrophoric material or mostly solids at room temperature and are not convenient to use, although some of them readily volatize with mild heating.

To deposit binary or ternary oxide films that contain gallium, precursors with similar properties are preferred. The most referenced indium and zinc molecules are trimethyl indium and diethyl zinc. These 2 compounds are pyrophoric, which is a great safety concern, a cost-adder. In addition, trimethyl indium is a solid at room temperature with a melting point at 88° C. The usage of solids is not preferred as it is also increasing costs.

Some teams developed new indium or zinc compounds of interest. For instance, WO2020179748A1 discloses the usage of iso-pentyl-cyclopentadienyl indium for indium containing depositions. The molecule is liquid, not pyrophoric, and exhibits a vapor pressure of 1 torr at 65° C. Depositions in ALD mode of indium oxide or indium at 250° C. are disclosed.

R. G Gordon et al. discloses the synthesis of diethylzinc adducted with tetramethylethylenediamine, TMEDA, as well as its usage for zinc oxide depositions in CVD mode (Optimization of Transparent and Reflective Electrodes for Amorphous Silicon Solar Cells, National Renewable Energy Laboratory, 1998). The molecule is not pyrophoric while diethylzinc is. The authors report that the corresponding fluorine-doped $ZnO_2$ CVD process is more controllable and reproducible, and the films have a better uniformity (than with diethyl zinc). The molecule is a solid but other adducted diethyl zinc compounds are liquids, such as diethylzinc-tetraethylethylenediamine, diethylzinc—TEEDA. Internally, the authors of this present disclosure measured the vapor pressure of diethyl zinc-tetraethylethylenediamine to be 1 torr at 69° C.

In conclusion, there is a need to develop a gallium compound for the deposition of binary, ternary, or quaternary oxide films that is liquid at room temperature, halide-free, not pyrophoric, is thermal stable, has a high vapor pressure and in addition there is a value in identifying additional metallic precursors that have similar properties in order to develop the best deposition processes.

SUMMARY OF THE INVENTION

Disclosed is a method of deposition of a gallium-containing oxide film on a substrate, the method comprising the steps of:
a) simultaneously or sequentially, exposing the substrate to a vapor of a gallium-containing film-forming composition that contains a gallium precursor and an oxidizer; and
b) depositing at least part of the gallium precursor onto the substrate to form the gallium-containing oxide film on the substrate through a vapor deposition process,
wherein the gallium precursor has the formula:

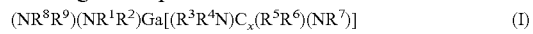

and the corresponding structures:

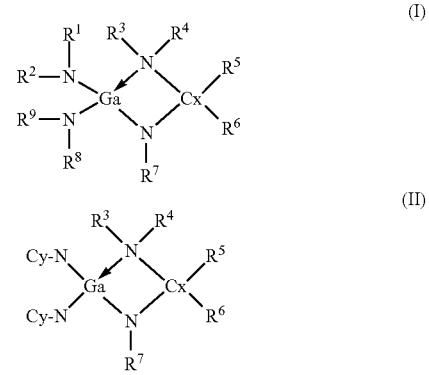

wherein, $R^1$, $R^2$, $R^3$, $R^4$, $R^5$, $R^6$, $R^7$, $R^8$, $R^9$ are independently selected from H, Me, Et, nPr, iPr, nBu, iBu, sBu, or tBu; $R^1$, $R^2$, $R^3$, $R^4$, $R^5$, $R^6$, $R^7$, $R^8$, $R^9$ may be the same or different; x=2, 3, 4, preferably x=2; Cy-N refers to saturated N-containing rings or unsaturated N-containing rings; the N-containing rings comprising at least one nitrogen atom and 4-6 carbon atoms in a chain.

The disclosed method may include one or more of the following aspects:
the Cy-NH includes pyrroline, pyrrole and piperidine, as follows:

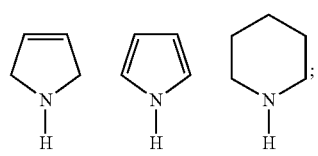

the gallium precursor including $(NMe_2)_2Ga(EtNCH_2CH_2NMe_2)$, $(NMe_2)_2Ga(EtNCH_2CH_2NEt_2)$, $(NEtMe)_2Ga(EtNCH_2CH_2NMe_2)$, $(NEtMe)_2Ga(EtNCH_2CH_2NEt_2)$, $(NEt_2)_2Ga(EtNCH_2CH_2NMe_2)$, $(NEt_2)_2Ga(EtNCH_2CH_2NEt_2)$ and $(NMe_2)_2Ga(MeNCH_2CH_2NMe_2)$;

the gallium precursor being $(NMe_2)_2Ga(EtNCH_2CH_2NMe_2)$;

the gallium precursor being $(NMe_2)_2Ga(EtNCH_2CH_2NEt_2)$;

the gallium precursor being $(NEtMe)_2Ga(EtNCH_2CH_2NMe_2)$;

the gallium precursor being $(NEtMe)_2Ga(EtNCH_2CH_2NEt_2)$;

the gallium precursor being $(NEt_2)_2Ga(EtNCH_2CH_2NMe_2)$;

the gallium precursor being $(NEt_2)_2Ga(EtNCH_2CH_2NEt_2)$;

the gallium precursor being $(NMe_2)_2Ga(MeNCH_2CH_2NMe_2)$;

further comprising the step of a1) at steps a), simultaneously or sequentially, exposing the surface to a vapor of a first metal ($M^1$) precursor, so that at least part of the first metal ($M^1$) precursor and the at least part of the gallium precursor are deposited onto the substrate to form the gallium-containing oxide film on the substrate through the vapor deposition process, wherein the gallium-containing oxide film is a $M^1GaO$ film;

further comprising the step of a2) at steps a1), simultaneously or sequentially, exposing the surface to a vapor of a second metal ($M^2$) precursor, so that at least part of the second metal ($M^2$) precursor, the at least part of the gallium precursor and the at least part of the first metal ($M^1$) precursor are deposited onto the substrate to form the gallium-containing oxide film on the substrate through the vapor deposition process, wherein the gallium-containing oxide film is a $M^1M^2GaO$ film;

further comprising the step of purging with an inert gas between each exposure to the film-forming composition, the first metal ($M^1$) precursor, the second metal ($M^2$) precursor, the oxidizer and mixtures thereof;

the inert gas being selected from $N_2$, He, Ar, Kr or Xe;

the inert gas being $N_2$;

the inert gas being Ar;

the first metal ($M^1$) precursor being an indium precursor;

the first metal ($M^1$) precursor being a zinc precursor;

the second metal ($M^2$) precursor being an indium precursor;

the second metal ($M^2$) precursor being a zinc precursor;

the indium precursor being selected from trialkyl indium, sec-Pentyl-cyclopentadienyl Indium or iso-Pentyl-cyclopentadienyl Indium;

the indium precursor being trialkyl indium;

the indium precursor being iso-Pentyl-cyclopentadienyl Indium;

the indium precursor being sec-Pentyl-cyclopentadienyl Indium;

the zinc precursor being a diethyl zinc derivative selected from diethyl zinc-tetramethylethylenediamine adduct (TMEDA), diethyl zinc-tetraethylethylenediamine adduct (TEEDA), diethyl zinc-N,N'-diethyl-N,N'-diethyl-ethylenediamine adduct, diethyl zinc-N,N-dimethyl-N',N'-diethylethylenediamine adduct, or diethyl zinc-N,N,N'-trimethyl-N'ethylethylenediamine adduct;

the zinc precursor being diethyl zinc-tetramethylethylenediamine adduct (TMEDA);

the zinc precursor being diethyl zinc-tetraethylethylenediamine adduct (TEEDA);

the zinc precursor being diethyl zinc-N,N'-diethyl-N,N'-diethyl-ethylenediamine adduct;

the zinc precursor being diethyl zinc-N,N-dimethyl-N',N'-diethylethylenediamine adduct;

the zinc precursor being diethyl zinc-N,N,N'-trimethyl-N'ethylethylenediamine adduct;

the $M^1GaO$ film being an InGaO film;

the $M^1GaO$ film being a ZnGaO film;

the $M^1M^2GaO$ film being an IGZO film;

the gallium-containing oxide film being an InGaO film;

the gallium-containing oxide film being a ZnGaO film;

the gallium-containing oxide film being an IGZO film;

the oxidizer being $O_2$, $O_3$, $H_2O$, $H_2O_2$, NO, $N_2O$, $NO_2$, oxygen containing radicals such as O· or OH·;

the oxidizer being $O_3$;

the oxidizer being $O_2$;

the oxidizer being plasma treated;

the gallium-containing film-forming composition including an inert carrier gas;

the inert carrier gas being selected from $N_2$, He, Ne, Ar, Kr, Xe, or combinations thereof;

the inert carrier gas being $N_2$ or Ar;

the melting point of the gallium precursor being below approximately 60° C.;

the melting point of the gallium precursor being below approximately 20° C.;

the gallium precursor being not pyrophoric;

the gallium precursor being liquid at room temperature;

the gallium precursor being liquid at a temperature ranging from room temperature to approximately 60° C.;

the vapor deposition process being a ALD process, a CVD process or a combination thereof;

the vapor deposition process being a ALD process;

the vapor deposition process being a CVD process;

the vapor deposition process being a PEALD process;

the deposition pressure being held between about 10-3 Torr and about 100 Torr;

the deposition pressure being held between about 10-2 Torr and 10 Torr;

the deposition temperature being held between about 100° C. and about 600° C.;

the deposition temperature being held between about 150° C. and about 500°;

the gallium precursor having a purity ranging from approximately 93% w/w to approximately 100% w/w;

the gallium precursor having a purity ranging from approximately 99% w/w to approximately 99.999% w/w;

the indium precursor having a purity ranging from approximately 93% w/w to approximately 100% w/w;

the indium precursor having a purity ranging from approximately 99% w/w to approximately 99.999% w/w;

the zinc precursor having a purity ranging from approximately 93% w/w to approximately 100% w/w;

the zinc precursor having a purity ranging from approximately 99% w/w to approximately 99.999% w/w;

the gallium-containing film-forming composition having a purity ranging from approximately 93% w/w to approximately 100% w/w; and the gallium-containing film-forming composition having a purity ranging from approximately 99% w/w to approximately 99.999% w/w.

Also disclosed is a method of deposition of a gallium-containing quaternary oxide (M¹M²GaO) film on a substrate, the method comprising the steps of:

a) simultaneously or sequentially, exposing the substrate to a vapor of a gallium-containing film-forming composition that contains a gallium precursor, a vapor of a first metal (M¹) precursor, a vapor of a second metal (M²) precursor, and an oxidizer; and b) depositing at least part of the gallium precursor, at least part of the first metal (M¹) precursor and at least part of the second metal (M²) precursor onto the substrate to form the gallium-containing quaternary oxide film (M¹M²GaO) on the substrate through a vapor deposition process, wherein the gallium precursor has the formula:

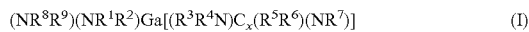

(NR⁸R⁹)(NR¹R²)Ga[(R³R⁴N)C$_x$(R⁵R⁶)(NR⁷)]  (I)

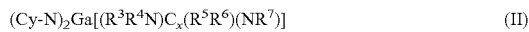

(Cy-N)₂Ga[(R³R⁴N)C$_x$(R⁵R⁶)(NR⁷)]  (II)

and the corresponding structures:

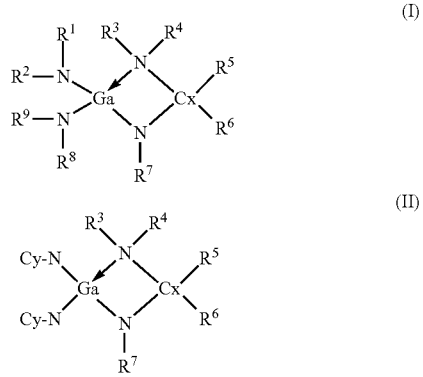

wherein, R¹, R², R³, R⁴, R⁵, R⁶, R⁷, R⁸, R⁹ are independently selected from H, Me, Et, nPr, iPr, nBu, iBu, sBu, or tBu; R¹, R², R³, R⁴, R⁵, R⁶, R⁷, R⁸, R⁹ may be the same or different; x=2, 3, 4, preferably x=2; Cy-N refers to saturated N-containing rings or unsaturated N-containing rings; the N-containing rings comprising at least one nitrogen atom and 4-6 carbon atoms.

Also disclosed is a method of deposition of an Indium Gallium Zinc oxide (IGZO) film on a substrate, the method comprising the steps of:

a) simultaneously or sequentially, exposing the substrate to a vapor of a gallium-containing film-forming composition that contains a gallium precursor, a vapor of an indium precursor, a vapor of a zinc precursor, and O₃; and b) depositing at least part of the gallium precursor, at least part of the indium precursor and at least part of the zinc precursor onto the substrate to form the IGZO film on the substrate through a vapor deposition process, wherein the gallium precursor has the formula:

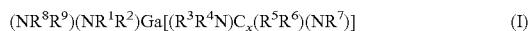

(NR⁸R⁹)(NR¹R²)Ga[(R³R⁴N)C$_x$(R⁵R⁶)(NR⁷)]  (I)

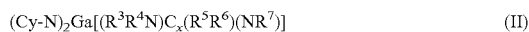

(Cy-N)₂Ga[(R³R⁴N)C$_x$(R⁵R⁶)(NR⁷)]  (II)

and the corresponding structures:

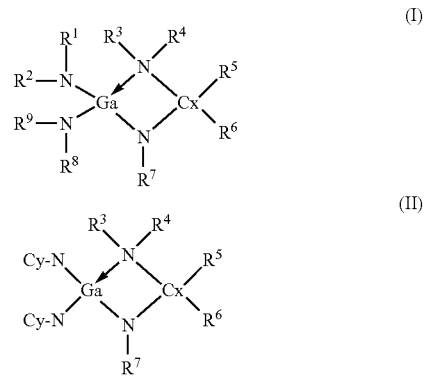

wherein, R¹, R², R³, R⁴, R⁵, R⁶, R⁷, R⁸, R⁹ are independently selected from H, Me, Et, nPr, iPr, nBu, iBu, sBu, or tBu; R¹, R², R³, R⁴, R⁵, R⁶, R⁷, R⁸, R⁹ may be the same or different; x=2, 3, 4, preferably x=2; Cy-N refers to saturated N-containing rings or unsaturated N-containing rings; the N-containing rings comprising at least one nitrogen atom and 4-6 carbon atoms.

Notation and Nomenclature

The following detailed description and claims utilize a number of abbreviations, symbols, and terms, which are generally well known in the art. Certain abbreviations, symbols, and terms are used throughout the following description and claims, and include:

As used herein, the indefinite article "a" or "an" means one or more.

As used herein, "about" or "around" or "approximately" in the text or in a claim means±10% of the value stated.

As used herein, "room temperature" in the text or in a claim means from approximately 20° C. to approximately 25° C.

The term "high thermal stability" refers to the property of a product to evaporate smoothly in thermogravimetry analysis, without exhibiting a "tail" or generating residual amount above 200° C. herein, more preferably the residual amount is below about 5% at 300° C., more preferably below about 2% at 300° C., or a product whose DSC analysis exhibits an onset of decomposition temperature higher than that of commercially available products, and more preferably higher than 235° C.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., SiO₂, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, ZrO₂ based materials, HfO₂ based materials, TiO₂ based materials, rare earth oxide based materials, ternary oxide based materials, etc.) or nitride-based films (for example, TaN, TIN, NbN) that are used as electrodes. The substrate may also be a powder, such as the powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials. Exemplary powder substrate also includes activated carbon.

The term "wafer" or "patterned wafer" refers to a wafer having a stack of films on a substrate and at least the top-most film having topographic features that have been created in steps prior to the deposition of the indium containing film.

The term "aspect ratio" refers to a ratio of the height of a trench (or aperture) to the width of the trench (or the diameter of the aperture).

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line. Throughout the specification and claims, the wafer and any associated layers thereon are referred to as substrates.

Note that herein, the terms "aperture", "via", "hole" and "trench" may be used interchangeably to refer to an opening formed in a semiconductor structure.

As used herein, the abbreviation "NAND" refers to a "Negative AND" or "Not AND" gate; the abbreviation "2D" refers to 2 dimensional gate structures on a planar substrate; the abbreviation "3D" refers to 3 dimensional or vertical gate structures, wherein the gate structures are stacked in the vertical direction.

Note that herein, the terms "deposition temperature" and "substrate temperature" may be used interchangeably. It is understood that a substrate temperature may correspond to, or be related to a deposition temperature, and that the deposition temperature may refer to the substrate temperature.

Note that herein, the terms "precursor" and "deposition compound" and "deposition gas" may be used interchangeably when the precursor is in a gaseous state at room temperature and ambient pressure. It is understood that a precursor may correspond to, or be related to a deposition compound or deposition gas, and that the deposition compound or deposition gas may refer to the precursor.

The standard abbreviations of the elements from the periodic table of elements are used herein. It should be understood that elements may be referred to by these abbreviations (e.g., Si refers to silicon, N refers to nitrogen, O refers to oxygen, C refers to carbon, H refers to hydrogen, F refers to fluorine, etc.).

The unique CAS registry numbers (i.e., "CAS") assigned by the Chemical Abstract Service are provided to identify the specific molecules disclosed.

As used herein, the term "alkyl group" refers to saturated functional groups containing exclusively carbon and hydrogen atoms. An alkyl group is one type of hydrocarbon. Further, the term "alkyl group" refers to linear, branched, or cyclic alkyl groups. Examples of linear alkyl groups include without limitation, methyl groups, ethyl groups, propyl groups, butyl groups, etc. Examples of branched alkyls groups include without limitation, t-butyl. Examples of cyclic alkyl groups include without limitation, cyclopropyl groups, cyclopentyl groups, cyclohexyl groups, etc.

As used herein, the abbreviation "Me" refers to a methyl group; the abbreviation "Et" refers to an ethyl group; the abbreviation "Pr" refers to any propyl group (i.e., n-propyl or isopropyl); the abbreviation "iPr" refers to an isopropyl group; the abbreviation "Bu" refers to any butyl group (n-butyl, iso-butyl, tert-butyl, sec-butyl); the abbreviation "(Bu" refers to a tert-butyl group; the abbreviation "sBu" refers to a sec-butyl group; the abbreviation "iBu" refers to an iso-butyl group; the abbreviation "Ph" refers to a phenyl group; the abbreviation "Amy" refers to any amyl group (iso-amyl, sec-amyl, tert-amyl); the abbreviation "Cy" refers to a cyclic hydrocarbon group (cyclobutyl, cyclopentyl, cyclohexyl, etc.); the abbreviation "Ar" refers to an aromatic hydrocarbon group (phenyl, xylyl, mesityl, etc.). As used in the disclosed embodiments, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

Ranges may be expressed herein as from about one particular value, and/or to about another particular value. When such a range is expressed, it is to be understood that another embodiment is from the one particular value and/or to the other particular value, along with all combinations within said range. Any and all ranges recited in the disclosed embodiments are inclusive of their endpoints (i.e., x=1 to 4 or x ranges from 1 to 4 includes x=1, x=4, and x=any number in between), irrespective of whether the term "inclusively" is used.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of"; "comprising" may therefore be replaced by "consisting essentially of" or "consisting of" and remain within the expressly defined scope of "comprising".

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

"Providing" in a claim is defined to mean furnishing, supplying, making available, or preparing something. The step may be performed by any actors in the absence of express language in the claim to the contrary.

BRIEF DESCRIPTION OF THE DRAWINGS

For a further understanding of the nature and objects of the present invention, reference should be made to the following detailed description, taken in conjunction with the accompanying drawings, in which like elements are given the same or analogous reference numbers and wherein.

DESCRIPTION OF PREFERRED EMBODIMENTS

Figure 1:
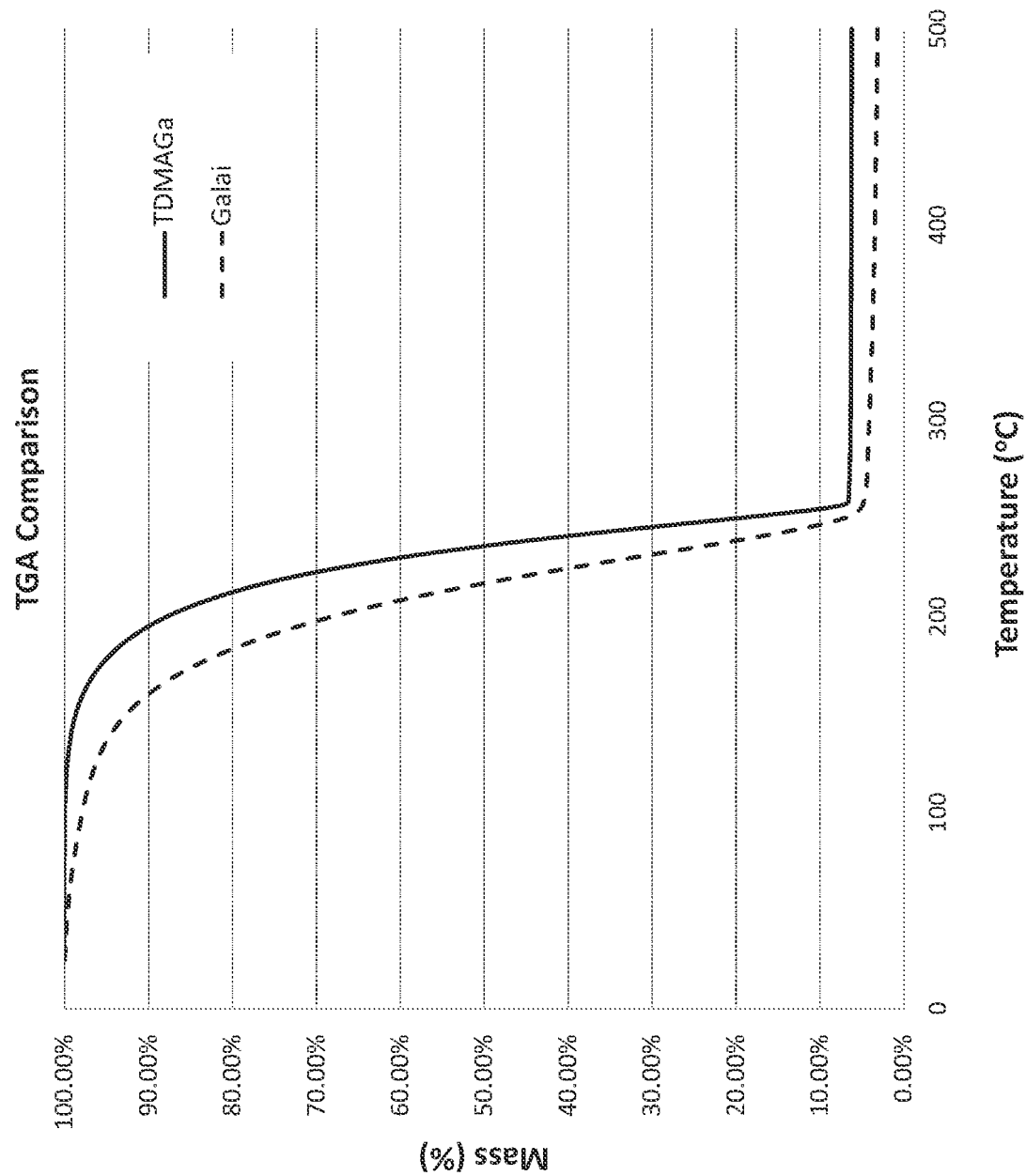
FIG. 1 is a comparison of the TGA performed for tris(dimethylamino)Gallium (TDMAGa) and $(NMe_2)_2Ga(EtNCH_2CH_2NMe_2)$.

Disclosed are gallium-containing film-forming compositions comprising a gallium precursor containing aminoamide ligands, methods of using the same to deposit gallium-containing oxide films, such as Indium Gallium Zinc Oxide (IGZO) films, for manufacturing semiconductor devices. The gallium containing oxide films may be binary, ternary or quaternary gallium oxide films. The disclosed gallium precursors are liquid at a temperature ranging from room temperature to approximately 60° C., volatile, non-pyrophoric, halogen-free, gallium amino compounds. The disclosed gallium precursors are preferably liquid at around 20° C. The melting point of the gallium precursor is below approximately 60° C., preferably, the melting point of the gallium precursor is below approximately 20° C. The volatility and thermal stability of the disclosed gallium precursors are higher than those existing gallium precursor, such as tris(dimethylamino)Gallium $(Ga(NMe_2)_3$, TDMAGa), which is a solid that melts at around 110° C. and has been used as the main Ga source in gallium oxide containing films such as IGZO. The disclosed gallium precursors are liquid at room temperature, allowing their preparation, synthesis, purification, storage in canisters and delivery to a liquid delivery system being simply operated. These properties are beneficial to industry for cost savings when the precursors are used in high volume manufacturing (HVM).

The disclosed gallium precursors are not pyrophoric, which decreases the costs related to the safety. It is known pyrophoric chemicals cannot be shipped by air and have to be shipped by ocean freight. The necessity to use the boat for international shipments is a clear cost adder during the development phase, the ramp phase, and even the mass manufacturing stage, depending on the volumes. In addition, shipping time and container quality requirements with the boat shipping, storage and specific regulations for pyrophoric products lead to increased production costs.

The disclosed gallium precursors are halogen-free, which fits with the two molecules of such as indium and zinc precursors used in the disclosed process. As such, there may be no corrosion effect in a full system, which will also decrease the cost of the process, because there is no need to use special construction anti-corrosion materials, special O-rings, or special and expensive pumps, decreasing the need for maintenance, or the like.

The higher volatility of the disclosed gallium precursors compared to TDMAGa (see Table 1) allows the user to provide a bigger flow of the disclosed gallium precursors in a reactor compared to TDMAGa while heating the container at the same temperature. The higher partial pressure of Ga may result in a faster deposition rate compared to TDMAGa. The faster deposition rate may decrease the cost of fabrication. One may also be able to increase the Ga content in the film, which could result in a flexibility to tune the film composition. The higher stability of the disclosed gallium precursors, as exhibited by the thermogravimetry measurements, compared to that of TDMAGa enables them to tune the deposition process window. As the disclosed molecules are more stable, they may allow to deposit films in ALD mode at higher temperature than that of the current molecules such as TDMAGa. The ability to deposit films at higher temperature usually enables the films deposited to be of higher quality, namely, lower impurity content, carbon or nitrogen. In some cases, the possibility to deposit films at a high temperature, while still being in ALD mode, may deposit the films in a different crystal phase that may have better properties than the film deposited at lower temperatures due to higher mobility, etc.

The disclosed gallium precursors have the following general formulae:

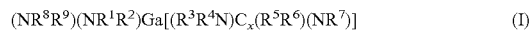   (I)

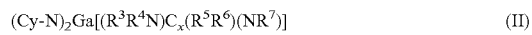   (II)

and the following corresponding structures:

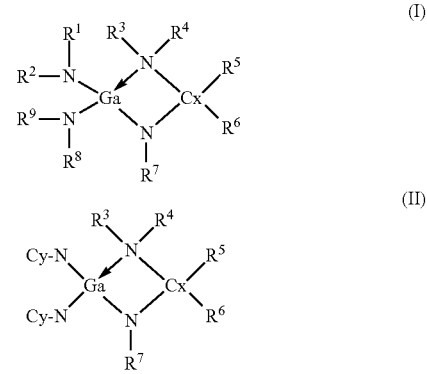

In (I), $R^1, R^2, R^3, R^4, R^5, R^6, R^7, R^8, R^9$ are independently selected from H, Me, Et, nPr, iPr, nBu, iBu, sBu, or tBu; $R^1, R^2, R^3, R^4, R^5, R^6, R^7, R^8, R^9$ may be the same or different; x=2, 3, 4, preferably x=2;

In (II), $R^3, R^4, R^5, R^6, R^7$ are independently selected from H, Me, Et, nPr, iPr, nBu, iBu, sBu, or tBu; $R^3, R^4, R^5, R^6, R^7$ may be the same or different; x=2, 3, 4, preferably x=2; Cy-N refers to saturated N-containing rings or unsaturated N-containing rings; the N-containing rings comprising at least one nitrogen atom and 4-6 carbon atoms in a chain; Examples of Cy-NH include pyrroline, pyrrole and piperidine, etc., as follows:

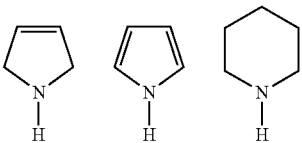

Exemplary disclosed gallium precursors include

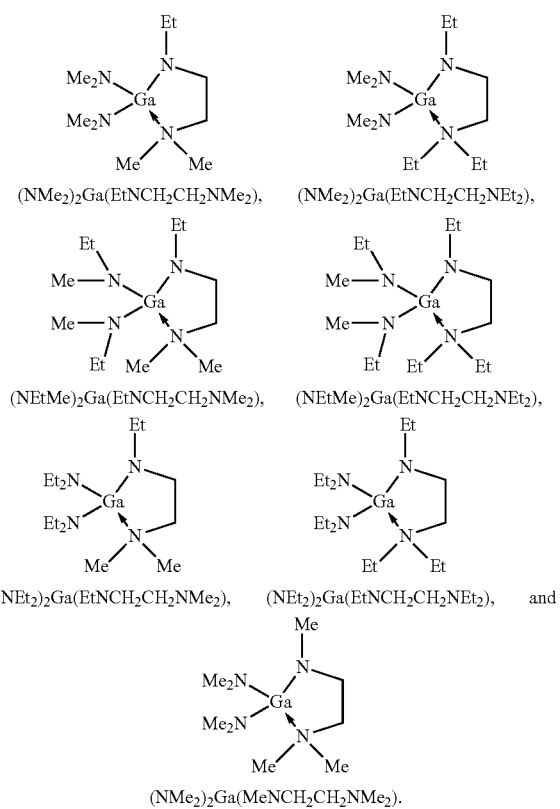

The disclosed gallium precursors are (NMe$_2$)$_2$Ga(EtNCH$_2$CH$_2$NMe$_2$), (NMe$_2$)$_2$Ga(EtNCH$_2$CH$_2$NEt$_2$), (NEtMe)$_2$Ga(EtNCH$_2$CH$_2$NMe$_2$), (NEtMe)$_2$Ga(EtNCH$_2$CH$_2$NEt$_2$), (NEt$_2$)$_2$Ga(EtNCH$_2$CH$_2$NMe$_2$), (NEt$_2$)$_2$Ga(EtNCH$_2$CH$_2$NEt$_2$) and (NMe$_2$)$_2$Ga(MeNCH$_2$CH$_2$NMe$_2$).

The disclosed gallium precursors may have the following features that make them suitable for gallium oxide and multimetal gallium-containing oxide film depositions. In one aspect, the disclosed gallium precursors are liquid at room temperature that render the disclosed gallium precursors much more volatile and higher thermally stable than the reference Ga compound, TDMAGa, with sufficient vapor pressures at lower temperatures. In another aspect, disclosed gallium precursors are non-pyrophoric compounds that allows for their easy preparation, synthesis, purification, storage and delivery for an application to semiconductor industry. The disclosed gallium precursors may be suitable for using as deposition precursors in the formation of gallium-oxide films and multimetal gallium-containing oxide films, including, IGZO films.

The disclosed gallium precursors are suitable for useful as precursors for gallium oxide film, gallium indium oxide film, gallium zinc oxide film and IGZO film depositions. Again, the disclosed gallium precursors are non-pyrophoric and volatile liquid compounds in room temperature with excellent vapor pressure and superior thermal stability. The main properties (vapor pressure, melting point) of the disclosed gallium precursors are closer to those of the standardly used indium and zinc precursors, such as trimethyl indium or diethyl zinc, than currently used gallium precursors, such as TDMAGa.

The disclosed gallium precursors have high thermal stability and may be used for forming high-speed, high sensitivity semiconductor layers, e.g. in CMOS systems, 3D NAND channel or in photodetectors. The disclosed gallium precursors are suitable to deposit the corresponding element-containing films and its related use for deposition of the corresponding element-containing layers.

The disclosed film-forming composition may include the disclose gallium precursor, co-reactants, carrier gas or the like. The co-reactants may include additional one or more precursors, and an oxidizer such as O$_2$ or O$_3$, or the like. The disclosed gallium precursors and the disclosed film-forming compositions are suitable for forming gallium oxide thin films, such as Ga$_2$O$_3$, etc., used in electronic fields. The disclosed gallium precursors and the disclosed film-forming compositions are suitable for fabrications of indium gallium oxide film, zinc gallium oxide film and indium gallium zinc oxide (IGZO) film applied in displays, semiconductors, Logic and memories industries, and the like.

The disclosure also includes processes for forming a gallium oxide film, indium gallium oxide film, zinc gallium oxide film and indium gallium zinc oxide (IGZO) film using the disclosed gallium precursors by vapor deposition methods, such as ALD or CVD. The disclosed are a deposition process where the disclosed gallium precursors are used and introduced into a reaction chamber for deposition a film by ALD, CVD, spin-on, spray, dip coating, slit coating or any other deposition technique to form a film, in combination with or without the co-reactant, that is, one or more oxidants (for example O$_2$ and O$_3$, or H$_2$O and H$_2$O$_2$), simultaneously and/or sequentially. The disclosed deposition processes using the disclosed gallium precursors may be assisted by heating, light, direct or remote plasma, or combination thereof.

The co-reactant may be the additional one or more precursors besides the disclosed gallium precursor. The co-reactant may be an indium precursor, a zinc precursor or combination thereof. The additional precursor may be selected from any non-pyrophoric, liquid, halide-free indium or zinc molecules whose vapor pressure is 1 torr at a temperature below 100° C., preferably, the vapor pressure is 1 torr below 80° C.

Furthermore, the co-reactant may be an oxidizing gas such as one of O$_2$, O$_3$, H$_2$O, H$_2$O$_2$, NO, N$_2$O, NO$_2$, oxygen containing radicals such as O$^-$ or OH$^-$, alcohol, silanols, aminoalcohols, carboxylic acids such as formic acid, acetic acid, propionic acid, para-formaldehyde, other oxidizing compounds and mixtures thereof. Preferably, the oxidizing gas is selected from the group consisting of O$_2$, O$_3$, H$_2$O$_2$, and H$_2$O. Preferably, when an ALD process is performed, the co-reactant is plasma treated oxygen, ozone, or combinations thereof. The resulting gallium-containing oxide film will be a gallium oxide film.

The co-reactant may be treated by a plasma, in order to decompose the reactant into its radical form, O$_3$ and O$_2$ may be utilized as an oxygen source gas, when treated with plasma. The plasma source may be a He plasma, Ar plasma, and mixtures thereof. For instance, the plasma may be generated with a power ranging from about 10 W to about 1000 W, preferably from about 50 W to about 500 W. The plasma may be generated present within the reactor itself. Alternatively, the plasma may generally be at a location removed from the reactor, for instance, in a remotely located plasma system. One of skill in the art will recognize methods and apparatus suitable for such plasma treatment.

For example, the co-reactant may be introduced into a direct plasma reactor, which generates plasma in the reaction chamber, to produce the plasma-treated reactant in the reaction chamber. The co-reactant may be introduced and held in the reaction chamber prior to plasma processing. Alternatively, the plasma processing may occur simultaneously with the introduction of the reactant.

Alternatively, the plasma-treated co-reactant may be produced outside of the reaction chamber, for example, a remote plasma to treat the co-reactant prior to passage into the reaction chamber.

Also disclosed are methods for forming gallium-containing oxide layers on a substrate using a vapor deposition process. Applicants believe that the disclosed film-forming compositions are suitable for ALD. More particularly, the disclosed film-forming compositions are capable of surface saturation, self-limited growth per cycle, and perfect step coverage exceeding 90% on aspects ratios of holes, trenches or the like ranging from approximately 2:1 to approximately 200:1, and preferably from approximately 20:1 to approximately 150:1, and more preferably from approximately 50:1 to approximately 100:1. Additionally, the disclosed film-forming compositions have high decomposition temperatures, indicating good thermal stability to enable ALD. The high decomposition temperatures permit ALD at higher temperatures, resulting in films having higher purity. The disclosed methods may be useful in the manufacture of semiconductor, photovoltaic, LCD-TFT, flat panel type devices.

The disclosed gallium-containing film-forming compositions may be used to deposit gallium-containing oxide films using any deposition methods known to those of skill in the art. Examples of suitable deposition methods include chemical vapor deposition (CVD) or atomic layer deposition (ALD) with or without plasma enhancement. Exemplary ALD methods include thermal ALD, plasma enhanced ALD (PEALD), spatial isolation ALD, temporal ALD, selective or not ALD, hot-wire ALD (HWALD), radicals incorporated ALD, flowable ALD (thermal or plasma) with or without use of inhibitor(s), and combinations thereof. The deposition method is preferably ALD, PE-ALD, or spatial ALD in order to provide suitable step coverage and film thickness control. Exemplary CVD methods include metal-organic CVD (MOCVD), thermal CVD, pulsed CVD (PCVD), low pressure CVD (LPCVD), sub-atmospheric CVD (SACVD) or atmospheric pressure CVD (APCVD), hot-wire CVD or hot filament CVD (also known as cat-CVD, in which a hot wire serves as an energy source for the deposition process), hot wall CVD, cold wall CVD, aerosol assisted CVD, direct liquid injection CVD, combustion CVD, hybrid physical-CVD, metalorganic CVD, rapid thermal CVD, photo-initiated CVD, laser CVD, radicals incorporated CVD, plasma enhanced CVD (PECVD) including but not limited to flowable PECVD, and combinations thereof.

The disclosed gallium-containing film-forming composition contains less than 5% v/v, preferably less than 1% v/v, more preferably less than 0.1% v/v, and even more preferably less than 0.01% v/v of any of its analogs or other reaction products. This embodiment may provide better process repeatability. This embodiment may be produced by purification (e.g., distillation, sublimation, chromatography, etc.) of the gallium-containing film-forming composition.

Purity of the disclosed film-forming composition is greater than 93% w/w (i.e., 95.0% w/w to 100.0% w/w), preferably greater than 98% w/w (i.e., 98.0% w/w to 100.0% w/w), and more preferably greater than 99% w/w (i.e., 99.0% w/w to approximately 99.999% w/w or 99.0% w/w to 100.0% w/w). One of ordinary skill in the art will recognize that the purity may be determined by NMR spectroscopy and gas or liquid chromatography with mass spectrometry. The disclosed film-forming compositions may contain any of the following impurities: pyrazoles; pyridines; alkylamines; alkylimines; THF; ether; pentane; cyclohexane; heptanes; benzene; toluene; chlorinated metal compounds; lithium, sodium, potassium pyrazolyl. The total quantity of these impurities is preferably below 5% w/w (i.e., 0.0% w/w to 5.0% w/w), preferably below 2% w/w (i.e., 0.0% w/w to 2.0% w/w), and more preferably below 1% w/w (i.e., 0.0% w/w to 1.0% w/w). The disclosed film-forming composition may be purified by recrystallization, sublimation, distillation, and/or passing the gas liquid through a suitable adsorbent, such as 4 Å molecular sieves.

Purification of the disclosed film-forming composition may also result in metal impurities each range independently at the 0 ppbw to 1 ppmw, preferably approximately 0 to approximately 500 ppbw (part per billion weight) level, more preferably from approximately 0 ppbw to approximately 100 ppbw, and even more preferably from approximately 0 ppbw to approximately 10 ppbw. These metal or metalloid impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Germanium (Ge), Hafnium (Hf), Zirconium (Zr), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), and Vanadium (V).

Care should be taken to prevent exposure of the disclosed gallium-containing film-forming compositions to water as this may result in decomposition of the disclosed gallium precursors to a $Ga(OH)_3$.

The disclosed film-forming compositions may be supplied either in neat form or in a blend with a suitable solvent, such as ethyl benzene, xylene, mesitylene, decalin, decane, dodecane. The disclosed precursors may be present in varying concentrations in the solvent.

The neat blended film-forming compositions are introduced into a reactor in a vapor form by conventional means, such as tubing and/or flow meters. The vapor form may be produced by vaporizing the neat blended composition through a conventional vaporization step such as direct vaporization, distillation, by bubbling, or by using a sublimator. The neat blended composition may be fed in liquid state to a vaporizer where it is vaporized before it is introduced into the reactor. Alternatively, the neat blended composition may be vaporized by passing a carrier gas into a container containing the composition by bubbling the carrier gas into the composition. The carrier gas may include, but is not limited to, Ar, He, $N_2$, and mixtures thereof. Bubbling with a carrier gas may also remove any dissolved oxygen present in the neat blended composition. The carrier gas and composition are then introduced into the reactor as a vapor.

If necessary, the container containing the disclosed film-forming composition may be heated to a temperature that permits the composition to have a sufficient vapor pressure.

The container may be maintained at temperatures in the range of, for example, approximately 0° C. to approximately 200° C. Those skilled in the art recognize that the temperature of the container may be adjusted in a known manner to control the amount of precursor vaporized.

The reactor may be any enclosure chamber within a device in which deposition methods take place such as without limitation, a parallel-plate type reactor, a cold-wall type reactor, a hot-wall type reactor, a single-wafer reactor, a multi-wafer reactor, other types of deposition systems under conditions suitable to cause the compounds to react and form the layers. One of ordinary skill in the art will recognize that any of these reactors may be used for either ALD or CVD deposition processes.

The reactor contains one more substrates onto which the films will be deposited. A substrate is generally defined as the material on which a process is conducted. The substrates may be any suitable substrate used in semiconductor, photovoltaic, flat panel, LCD-TFT device manufacturing. Examples of suitable substrates include wafers, such as silicon, silica, glass, GaAs wafers. The wafer may have one more layers of differing materials deposited on it from a previous manufacturing step. For example, the wafers may include a dielectric layer. Furthermore, the wafers may include silicon layers (crystalline, amorphous, porous, etc.), silicon oxide layers, silicon nitride layers, silicon oxy nitride layers, carbon doped silicon oxide (SiCOH) layers, metal, metal oxide metal nitride layers (Ti, Ru, Ta, etc.), and combinations thereof. Additionally, the wafers may include copper layers noble metal layers (e.g., platinum, palladium, rhodium, gold). The wafers may include barrier layers, such as manganese, manganese oxide, etc. Plastic layers, such as poly(3,4-ethylenedioxythiophene)poly(styrenesulfonate) [PEDOT:PSS] may also be used. The layers may be planar or patterned. The disclosed processes may deposit the layer directly on the wafer or directly on one or more layers on top of the wafer when patterned layers are formed on the substrate. The patterned layers may be alternating layers of two specific layers such as SiO and SiN used in 3D NAND. Furthermore, one of ordinary skill in the art will recognize that the terms "film" "layer" used herein refer to a thickness of some material laid on or spread over a surface and that the surface may be a trench a line. Throughout the specification and claims, the wafer and any associated layers thereon are referred to as substrates. For example, a gallium oxide film may be deposited onto a metal oxide layer, such as an $HfO_2$ layer.

The substrate final application is not limited to the present invention, but this technology may find particular benefits for the following types of substrates: silicon wafers, glass wafers and panels, beads, powders and nano-powders, monolithic porous media, printed circuit board, plastic sheets, etc. Exemplary powder substrates include a powder used in rechargeable battery technology. A non-limiting number of powder materials include NMC (Lithium Nickel Manganese Cobalt Oxide), LCO (Lithium Cobalt Oxide), LFP (Lithium Iron Phosphate), and other battery cathode materials.

The temperature and the pressure within the reactor are held at conditions suitable for vapor depositions, such as ALD and CVD. In other words, after introduction of the vaporized disclosed film-forming composition into the chamber, conditions within the chamber are such that at least part of the precursor is deposited onto the substrate to form a layer. For instance, the pressure in the reactor or the deposition pressure may be held between about 10-3 torr and about 100 torr, more preferably between about 10-2 torr and 10 torr, as required per the deposition parameters. Likewise, the temperature in the reactor or the deposition temperature may be held between about 100° C. and about 600° C., preferably between about 150° C. and about 500° C. One of ordinary skill in the art will recognize that "at least part of the precursor is deposited" means that some or all of the precursor reacts with adheres to the substrate.

The temperature to achieve optimal film growth may be controlled by either controlling the temperature of the substrate holder. Devices used to heat the substrate are known in the art. The substrate is heated to a sufficient temperature to obtain the desired film at a sufficient growth rate and with desired physical state and composition. A non-limiting exemplary temperature range to which the substrate may be heated includes from approximately 100° ° C. to approximately 600° C. When a plasma deposition process is utilized, the deposition temperature is preferably less than 400° C. Alternatively, when a thermal process is performed, the deposition temperature may range from approximately 100° C. to approximately 600° C.

Alternatively, the substrate may be heated to a sufficient temperature to obtain the desired gallium-containing oxide film at a sufficient growth rate and with desired physical state and composition. A non-limiting exemplary temperature range to which the substrate may be heated includes from room temperature to approximately 600° C. Preferably, the temperature of the substrate remains less than or equal to 500° C.

The ALD conditions within the chamber allow the disclosed film-forming composition adsorbed or chemisorbed on the substrate surface to react and form a film on the substrate. In some embodiments, Applicants believe that plasma-treating the co-reactant may provide the co-reactant with the energy needed to react with the disclosed film-forming composition. When the co-reactant in this exemplary ALD process is treated with a plasma, the exemplary ALD process becomes an exemplary PEALD process. The co-reactant may be treated with plasma prior subsequent to introduction into the chamber.

The film-forming composition and co-reactants may be introduced into the reactor sequentially (ALD). The reactor may be purged with an inert gas between the introduction of each of the film-forming composition, any additional precursors, and the co-reactants. Another example is to introduce the co-reactant continuously and to introduce the film-forming composition by pulse, while activating the co-reactant sequentially with a plasma, provided that the film-forming composition and the non-activated co-reactant do not substantially react at the chamber temperature and pressure conditions (CW PEALD).

Each pulse of the disclosed film-forming composition may last for a time period ranging from about 0.001 seconds to about 120 seconds, alternatively from about 1 seconds to about 80 seconds, alternatively from about 5 seconds to about 30 seconds. The co-reactant may also be pulsed into the reactor. In such embodiments, the pulse of each may last for a time period ranging from about 0.01 seconds to about 120 seconds, alternatively from about 1 seconds to about 30 seconds, alternatively from about 2 seconds to about 20 seconds. In another alternative, the vaporized film-forming compositions and co-reactants may be simultaneously sprayed from different sectors of a shower head (without mixing of the composition and the reactant) under which a susceptor holding several wafers is spun (spatial ALD).

Depending on the particular process parameters, deposition may take place for a varying length of time. Generally, deposition may be allowed to continue as long as desired necessary to produce a film with the necessary properties. Typical film thicknesses may vary from several angstroms to several hundreds of microns, and typically from 1 to 100 nm, depending on the specific deposition process. The deposition process may also be performed as many times as necessary to obtain the desired film.

The disclosed methods for forming a gallium-containing oxide layer on a substrate include: placing a substrate in a reactor, delivering into the reactor a vapor of the disclosed gallium-containing film-forming composition, and contacting/adsorbing the vapor with the substrate (and typically directing the vapor to the substrate) to form an gallium-containing oxide layer on the surface of the substrate. Alternatively, the disclosed methods for forming a gallium-containing oxide layer on a substrate include: placing a substrate in a reactor, exposing the substrate to a vapor of the disclosed gallium-containing film-forming composition, and depositing a gallium-containing oxide layer on the surface of the substrate.

The vapor of the gallium-containing film-forming composition is generated and then introduced into a reaction chamber containing a substrate. The temperature and the pressure in the reaction chamber and the temperature of the substrate are held at conditions suitable for vapor deposition of at least part of the disclosed gallium precursor onto the substrate. In other words, after introduction of the vaporized composition into the reaction chamber, conditions within the reaction chamber are adjusted such that at least part of the gallium precursor is deposited onto the substrate to form the gallium-containing oxide layer. One of ordinary skill in the art will recognize that "at least part of the gallium precursor is deposited" means that some or all of the precursor reacts with or adheres to the substrate. Herein, a co-reactant may also be used to help in formation of the gallium-containing oxide layer.

The disclosed film-forming compositions and co-reactants may be introduced into the reactor either simultaneously (CVD), sequentially (ALD) or different combinations thereof. The reactor may be purged with an inert gas (e.g., $N_2$, He, Ar, Kr or Xe) between the introduction of the film-forming composition and the introduction of the co-reactant. Alternatively, the co-reactant and the film-forming composition may be mixed together to form a co-reactant/compound mixture, and then introduced to the reactor in a mixture form. Another example is to introduce the co-reactant continuously and to introduce the disclosed film-forming composition by pulse (pulsed CVD).

In a non-limiting exemplary ALD process of forming a gallium oxide film, a binary film, the vapor phase of the disclosed film-forming composition, such as, $(NMe_2)_2Ga(EtNCH_2CH_2NMe_2)$, is introduced into the reactor, where it is contacted with a suitable substrate, either chemisorbed or physisorbed thereon. Excess composition may then be removed from the reactor by purging and/or evacuating the reactor, that is, either by purging a reactor with an inert gas (e.g., $N_2$, He, Ar, Kr or Xe), or passing the substrate in a sector under high vacuum and/or a carrier gas curtain. A co-reactant, e.g., $O_3$, is introduced into the reactor where it reacts with the adsorbed film-forming composition in a self-limiting manner. Any excess co-reactant is removed from the reactor by purging and/or evacuating the reactor. The desired film is the gallium oxide. This two-step process may provide the desired film thickness by repeating until a film having the desired thickness has been obtained. By alternating the provision of the gallium film-forming composition and co-reactant, a film of desired composition and thickness may be deposited.

Alternatively, if the desired indium-containing film contains three elements, such as InGaO and ZnGaO, a ternary film, the two-step process above (for example, forming the gallium oxide film) may be inserted by introduction of the vapor of an additional precursor compound into the reactor (three-step process). The additional precursor compound will be selected based on the nature of the film being deposited. The additional elements may include nitrogen (N), sulfur (S), phosphorous (P), Tin (Sn), arsenic (As), antimony (Sb), indium (In), zinc (Zn), and mixtures thereof. When the additional precursor compound is utilized, the resultant film deposited on the substrate contains gallium and co-reactant in combination with the additional element. When the additional precursor and the gallium precursor are used in more than one ALD super cycle sequences, a nanolaminate film is obtained. After introduction into the reactor, the additional precursor compound is contacted or adsorbed with the substrate. Afterward, any excess precursor compound is removed from the reactor by purging and/or evacuating the reactor. Depending on process requirements, a co-reactant, such as $O_2$, or an additional precursor may be introduced into the reactor to react with the gallium precursor compound. Excess co-reactant or precursor is removed from the reactor by purging and/or evacuating the reactor. In the final steps of the cycle, the remaining co-reactant or precursor may be introduced into the reactor and removal of excess is removed by purging and/or evacuation of the reactor. The entire three-step process may be repeated until a desired film thickness has been achieved. By alternating the provision of the gallium film-forming composition, additional precursor compound, and co-reactant, a film of desired composition and thickness may be deposited.

In one embodiment, the additional precursor may be an indium precursor. The indium precursor may be selected from any non-pyrophoric, liquid, halide-free indium molecules whose vapor pressure is 1 torr at a temperature below 100° C., preferably, the vapor pressure is 1 torr below 80° C. The indium precursor may be selected from trialkyl indium, sec-pentyl-cyclopentadienyl Indium and iso-pentyl-cyclopentadienyl Indium. Preferably, the indium precursor is iso-Pentyl-cyclopentadienyl Indium.

In an alternative embodiment, the additional precursor may be a zinc precursor. The zinc precursor may be selected from any non-pyrophoric, liquid, halide-free zinc molecules whose vapor pressure is 1 torr at a temperature below 100° C., preferably the vapor pressure is 1 torr below 80° C. The zinc precursor may be selected from a diethyl zinc derivative selected from diethyl zinc-tetramethylethylenediamine adduct (TMEDA), diethyl zinc-tetraethylethylenediamine adduct (TEEDA), diethyl zinc-N,N'-diethyl-N,N'-diethylethylenediamine adduct, diethyl zinc-N,N-dimethyl-N',N'-diethylethylenediamine adduct, diethyl zinc-N,N,N'-trimethyl-N'ethylethylenediamine adduct. Preferably, the zinc precursor is diethyl zinc-tetraethylethylenediamine adduct (TEEDA).

The disclosed gallium precursors have the vapor pressure closer to the vapor pressure of the indium precursor and the zinc precursor than the existing gallium precursors, such as TDMAGa, $Ga(NMe_2)_3$.

Alternatively, if the desired gallium-containing oxide film contains four elements such as InGaZnO (IGZO), a quaternary film, the three-step process above may be inserted by introduction of the vapor of another additional precursor compound into the reactor (four-step process). The other additional precursor compound will be selected based on the nature of the film being deposited. The additional elements may include N, S, P, Sn, As, Sb, In, Zn, and mixtures thereof.

When another additional precursor compound is utilized, the resultant film deposited on the substrate contains gallium in combination with the additional three elements. When the additional two precursors and the gallium precursor are used in more than one ALD super cycle sequences, a nanolaminate film is obtained. In case of forming IGZO films, the precursors may include an gallium precursor such as $(NMe_2)_2Ga(EtNCH_2CH_2NMe_2)$, an indium precursor such as, In(iso-Pentyl-cyclopentadienyl), a Zn precursor such as diethylzinc-TEEDA in combination with a co-reactant $O_3$. By alternating the provision of the gallium film-forming composition, additional precursor, another additional precursor and co-reactant, a film of desired composition and thickness may be deposited. Similarly, each excess composition or precursor may be removed from the reactor by purging and/or evacuating the reactor, that is, either by purging a reactor with an inert gas (e.g., $N_2$, He, Ar, Kr or Xe), or passing the substrate in a sector under high vacuum and/or a carrier gas curtain, after exposure.

The gallium oxide films resulting from the processes discussed above may include $Ga_xO_y$ (x=0.5 to 1.5, y=0.5 to 1.5), InZnO (IZO), InGaZnO (IGZO), or combination thereof or a pure gallium oxide layer. The gallium-containing oxide films may contain a second element selected from P, N, S, Ga, As, B, Ta, Hf, Nb, Mg, Al, Sr, Y, Ba, Ca, As, Sb, Bi, Sn, Pb, Co, one or more lanthanides, or combinations thereof. One of ordinary skill in the art will recognize that by appropriate selection of the film-forming composition and co-reactants, the desired film composition may be obtained. The disclosed methods may be useful in the manufacture of a semiconductor material, for example, gallium-containing oxide may serve as a semiconductor material, forming heterojunctions with p-InP, n-GaAs, n-Si, and other materials.

The disclosed gallium precursors have the vapor pressure closer to the vapor pressure of the additional precursor and the another additional precursor than existing gallium precursor, such as TDMAGa, $Ga(NMe_2)_3$.

Upon obtaining a desired film thickness, the film may be subject to further processing, such as thermal annealing, furnace-annealing, rapid thermal annealing, UV e-beam curing, and/or plasma gas exposure. Those skilled in the art recognize the systems and methods utilized to perform these additional processing steps. For example, the IGZO film may be exposed to a temperature ranging from approximately 100° C. and approximately 1000° C. for a time ranging from approximately 0.1 second to approximately 7200 seconds under an inert atmosphere, an O-containing atmosphere, and combinations thereof. Most preferably, the temperature range is 350° C. to 450° C. for 3600-7200 seconds under an inert atmosphere or an O-containing atmosphere.

The resulting film may contain fewer impurities and therefore may have an improved density resulting in improved leakage current. The annealing step may be performed in the same reaction chamber in which the deposition process is performed. Alternatively, the substrate may be removed from the reaction chamber, with the annealing/flash annealing process being performed in a separate apparatus. Any of the above post-treatment methods, but especially thermal annealing, has been found effective to reduce carbon and nitrogen contamination of the IGZO film. This in turn tends to improve the resistivity of the film.

After annealing, the films deposited by any of the disclosed processes may have a bulk resistivity at room temperature of approximately 50 uohm-cm to approximately 1,000 ohm cm. Room temperature is approximately 20° C. to approximately 25° C. depending on the season. Bulk resistivity is also known as volume resistivity. One of ordinary skill in the art will recognize that the bulk resistivity is measured at room temperature on the films that are typically approximately 50 nm thick. The bulk resistivity typically increases for thinner films due to changes in the electron transport mechanism. The bulk resistivity also increases at higher temperatures.

EXAMPLES

The following non-limiting examples are provided to further illustrate embodiments of the invention. However, the examples are not intended to be all inclusive and are not intended to limit the scope of the inventions described herein.

Thermogravimetric (TG) analysis was performed at 25° C. to 500° C. under atmospheric (1000 mBar, $N_2$ 220 sccm) or vacuum (20 mBar, $N_2$ 20 sccm) by Aluminum open cup. Vapor pressure (VP) was determined by TG analysis. Bisalkylamino(trialkyldiamino)Gallium complexes can be prepared by reported methods and changing the required diamine ligand ("Monomeric Chelated Amides of Aluminum and Gallium: Volatile, Miscible Liquid Precursors for CVD", S. T. Barry, R. G. Gordon and V. A. Wagner, MRS Proceedings, 606, 1999, 83). $(NMe_2)_2Ga(EtNCH_2CH_2NMe_2)$ is liquid at room temperature. In contrast, TDMAGa is solid at room temperature as a reference (melting at around 110° C.).

Figure 2:
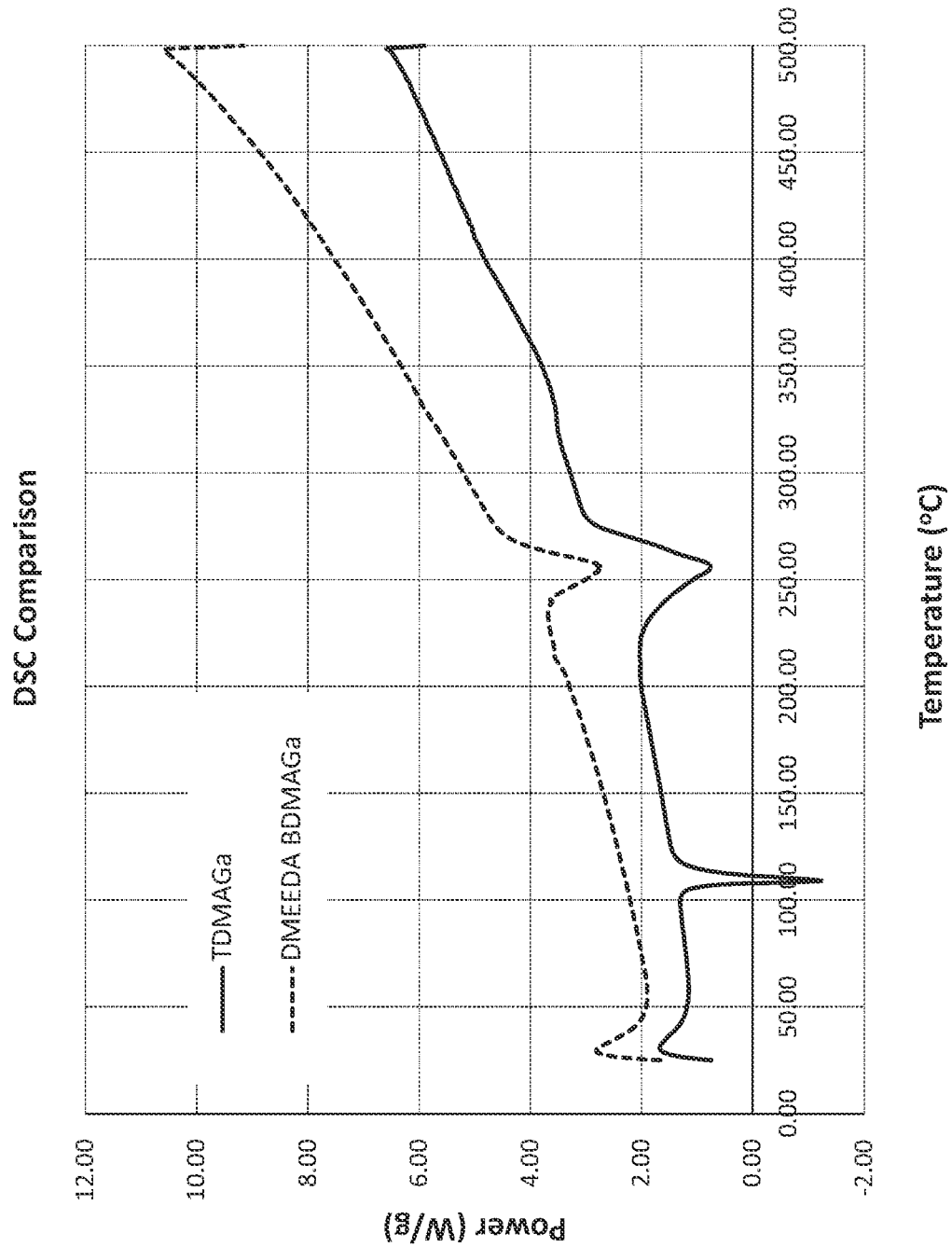
FIG. 2 is a comparison of the DSC performed for TDMAGa and $(NMe_2)_2Ga(EtNCH_2CH_2NMe_2)$.

The thermogravimetric analysis of the two same compounds is available on FIG. 1. It may be observed that the volatility of $(NMe_2)_2Ga(EtNCH_2CH_2NMe_2)$ is the highest as the evaporation is the fastest for this product, before TDMAGa. Moreover, the post-evaporation residual amount is lower for $(NMe_2)_2Ga(EtNCH_2CH_2NMe_2)$, which may be the sign of a higher thermal stability. Such a property is very important when considering a potential extension of the ALD window but also when considering the necessity to heat the molecule for a long period during its usage without observing any decomposition. This TGA result is a sign that $(NMe_2)_2Ga(EtNCH_2CH_2NMe_2)$ may behave better than TDMAGa from this point of view. FIG. 2 is DSC comparison of TDMAGa and $(NMe_2)_2Ga(EtNCH_2CH_2NMe_2)$.

Example 1

Table 1 summarizes some of the properties of the main molecules used for IGZO gas phase depositions, including TDMAGa, triethyl gallium (TEGa), $(NMe_2)_2Ga(EtNCH_2CH_2NMe_2)$, Trimethyl Indium (TMIn), Diethyl Zinc (DEZn). TDMAGa has a much lower vapor pressure than the other precursors. However, it has a merit of not being pyrophoric. $(NMe_2)_2Ga(EtNCH_2CH_2NMe_2)$ is also non-pyrophoric but its vapor pressure is much higher than that of TDMAGa and is liquid, which will facilitate the usage of the molecule and lower the cost associated with its usage.

TABLE 1

| Comparison of properties | | | | | |
|---|---|---|---|---|---|
| | TDMAGa | TEGa | (NMe$_2$)$_2$Ga(EtNCH$_2$CH$_2$NMe$_2$) | TMIn | DEZn |
| Pyrophoric | Not | Yes | Not | Yes | Yes |
| MP | ~107° C. | −82° C. | <10° C. | 88° C. | <0° C. |
| VP (1 torr temp) | 105° C. | ~−15° C. | 73° C. | ~10° C. | ~−15° C. |
| TGA residual % (at 400° C.) | 6.2% | N/A | 3.1% | N/A | N/A |
| DSC dec onset (° C.) | 235 | N/A | 241 | N/A | N/A |

Prophetic Example 1. Deposition of Gallium Oxide Film Using (NMe$_2$)$_2$Ga(EtNCH$_2$CH$_2$NMe$_2$) by CVD A container filled with (NMe$_2$)$_2$Ga(EtNCH$_2$CH$_2$NMe$_2$) may be heated in order to increase and adjust its vapor pressure. The selected temperature is often close to the 1 torr temperature but any other temperature may be used. Vapors of the gallium precursor (NMe$_2$)$_2$Ga(EtNCH$_2$CH$_2$NMe$_2$) are transported to a reaction chamber using an inert carrier gas, N$_2$ or Ar or any other gas, although it is not always required. An oxygen source, ozone in this case, is simultaneously introduced in the reaction chamber. Any other oxygen source, or mixture of sources, may be considered, such as oxygen or water. A wafer or piece of wafer, or any substrate, is placed in the reaction chamber that is heated between 200 and 300° C., but any other temperature may be considered. The pressure inside the reaction chamber is set between 0.1 and 10 torr, but any other pressure may be considered. The vapors of (NMe$_2$)$_2$Ga(EtNCH$_2$CH$_2$NMe$_2$) and ozone react at the surface of the heated substrate to form a Gallium oxide film. The film is of very good purity, with the carbon and nitrogen levels below the detection limit of the measuring tool (XPS). When ozone is replaced by another oxidant, for instance O$_2$ or H$_2$O, or even when any of 2 oxidants are supplied together, Gallium oxide films of good purity may also be obtained.

Prophetic Example 2. Deposition of Gallium Oxide Film Using (NMe$_2$)$_2$Ga(EtNCH$_2$CH$_2$NMe$_2$) by ALD A container filled with (NMe$_2$)$_2$Ga(EtNCH$_2$CH$_2$NMe$_2$) may be heated in order to increase and adjust its vapor pressure. The selected temperature is often close to the 1 torr temperature but any other temperature may be used. Vapors of the gallium precursor are transported to a reaction chamber using an inert carrier gas, N$_2$ or Ar or any other gas, although it is not always required. Ozone is used as the oxygen source. A wafer or piece of wafer, or any substrate, is placed in the reaction chamber that is heated at 250° C. The deposition cycle is split in 4 different steps. First, only the vapor of (NMe$_2$)$_2$Ga(EtNCH$_2$CH$_2$NMe$_2$) is introduced into the reaction chamber and adsorbs on the surface of the wafer or substrate (precursor pulse). Then, the vapor of (NMe$_2$)$_2$Ga(EtNCH$_2$CH$_2$NMe$_2$) is purged from the reaction chamber with an inert gas, such as, N$_2$ or Ar (precursor purge pulse). Then, the oxygen source, ozone, is introduced into the reaction chamber and reacts with (NMe$_2$)$_2$Ga(EtNCH$_2$CH$_2$NMe$_2$) on the surface of the wafer or substrate. Finally, the oxygen source is purged from the reaction chamber with an inert gas. Each of the 4 steps may last between a few tens of seconds or several seconds, depending on the configuration of the tool, the deposition pressure, the deposition temperature or other conditions. In this case, the precursor pulse was set at 4 seconds, the precursor purge pulse step was set at 20 seconds, the ozone pulse was set at 2 seconds, and the ozone purge step was set at 20 seconds. Shorter pulse times are expected to be obtained on better tools. The 4 steps cycle is then repeated until the desired thickness of gallium oxide film is obtained. The gallium oxide growth for each cycle of deposition is in the range of 0.5 to 1 Å. The obtained gallium oxide film has a low level of impurity and depositions on patterned substrates are of step coverage exceeding 90% in up to 50:1 aspect ratio holes or trenches. Similar film properties are obtained when oxygen or water are used instead of ozone but it is required to adjust their respective pulse times and purge times.

Prophetic Example 3. Deposition of Indium Gallium Zinc Oxide (IGZO) Film Using (NMe$_2$)$_2$Ga(EtNCH$_2$CH$_2$NMe$_2$) by ALD The deposition is conducted in a similar fashion as in the Prophetic Example 2 but two additional 4 steps cycles are added, allowing the deposition of indium oxide and zinc oxide, which forms an InGaZnO film (IGZO). Any indium or zinc precursors may be used, such as trimethyl indium, triethyl indium, diethylzinc, etc. In one exemplary embodiment, trimethylindium and diethylzinc may be used. Vapors of the Gallium, Indium, and Zinc precursors are introduced in a repetitive sequence fashion starting with gallium, then indium and zinc but any other sequences may be used. The cycles with the same metal may be repeated several times before switching to the next metal cycle in order to tune the film composition. Ozone, oxygen, and water (H$_2$O) are the most common oxygen sources and they are used in this embodiment, but any kind of oxidizer may be used instead. Different oxidizers may be used to react with each metal, for instance ozone with the gallium precursor and water with the indium precursor, as well as mixtures of them, for instance a mixture of ozone and water with the indium precursor and water only with the gallium precursor. The IGZO film is obtained in an ALD mode between 200 and 250° C., but a different temperature window may be obtained when a different tool is used or with different deposition conditions. The deposition rate is expected to be in the range of 1 to 2 Å per cycle (full cycle, includes the sub-cycles of the gallium indium, and zinc precursors). The obtained IGZO film has a low level of impurity, with carbon and nitrogen levels below the detection limit of the analytical tool (XPS). Depositions on patterned substrates exhibit a step coverage exceeding 90% in up to 50:1 aspect ratio holes or trenches.

Prophetic Example 4. Deposition of Indium Gallium Oxide Film Using (NMe$_2$)$_2$Ga(EtNCH$_2$CH$_2$NMe$_2$) and In(iso-Pentylcyclopentadienyl) by ALD The deposition is conducted in a similar fashion as in the Prophetic Example 3 but indium(iso-pentyl-cyclopentadienyl) is used instead of trimethyl indium or other indium precursor. No zinc precursor is used. Vapors of $(NMe_2)_2Ga(EtNCH_2CH_2NMe_2)$ and indium(sec-pentyl-cyclopentadienyl), may be introduced in any order; the cycles with the same metal may be repeated several times before switching to the next metal cycle in order to tune the film composition. Water was used as the oxygen source. It is possible to use different oxygen sources or mixtures of two different oxygen sources for each of the two precursors. In this case, the gallium precursor pulse time was set at 4 seconds, the indium precursor pulse time was set at 4 seconds, the water pulse time was set at 2 seconds, and both water purge times were set at 30 seconds. The indium-gallium-oxide film is obtained in ALD mode up to 250° C. and the deposition rate is in the range of 0.5 to 1.5 Å per cycle. The obtained film has a low level of impurity (below the detection limit of XPS) and depositions on patterned substrates exhibit a step coverage exceeding 90% in up to 50:1 aspect ratio holes or trenches. Similar film properties are obtained when ozone or oxygen are used instead of ozone but it is required to adjust their respective pulse times and purge times.

Prophetic Example 5. Deposition of IGZO Film Using $(NMe_2)_2Ga(EtNCH_2CH_2NMe_2)$, In(isoPentylcyclopentadienyl) and diethylzinc-TEEDA by CVD Containers filled with $(NMe_2)_2Ga(EtNCH_2CH_2NMe_2)$, In(isoPentylcyclopentadienyl), and diethylzinc-TEEDA may be heated in order to increase and adjust the vapor pressure of the precursors. The selected temperature is often close to the 1 torr temperature but any other temperature may be used. As these three precursors have similar vapor pressures, they may be heated at the same temperature so it is possible to put them together in the same oven. Vapors of the precursors as well as water are then provided simultaneously to a reaction chamber using an inert carrier gas, $N_2$ or Ar or any other gas ($O_2$ for water for instance), although it is not always required. A wafer or piece of wafer, or any substrate is placed in the reaction chamber that is heated between 200 and 400° C., but any other temperature may be considered. The pressure inside the reaction chamber is set between 0.1 torr and 10 torr, but any other pressure may be considered. The vapors of the three precursors and water react at the surface of the heated substrate to form an IGZO film. The IGZO film has a very good purity, with the carbon and nitrogen levels below the detection limit of the analytical tool (XPS). When water is replaced by another oxygen source, for instance Ozone ($O_3$) or oxygen ($O_2$), or even when any of two oxygen sources are supplied together, IGZO films of good purity are also obtained.

Prophetic Example 6. Deposition of IGZO Film Using $(NMe_2)_2Ga(EtNCH_2CH_2NMe_2)$, In(iso-Pentyl-cyclopentadienyl), and diethylzinc-TEEDA by ALD The deposition is conducted in a similar fashion as in the Prophetic Example 3 but indium(iso-pentyl-cyclopentadienyl) and diethyl zinc-TEEDA are used as indium and zinc precursors instead of trimethyl indium and diethylzinc. Vapors of $(NMe_2)_2Ga(EtNCH_2CH_2NMe_2)$, indium(iso-pentyl-cyclopentadienyl), and diethyl zinc-TEEDA may be introduced in any order; the cycles with the same metal may be repeated several times before switching to the next metal cycle in order to tune the film composition. Water is used as the oxygen source. Eventually different oxygen sources may be used to react with each metal. In this case, the gallium precursor pulse time as well as the Indium precursor pulse time and the zinc precursor pulse time were set at 4 seconds, the water pulse time was set at 2 seconds for the 3 pulses of the metallic precursors, and the three water purge times were set at 30 seconds. The IGZO film is obtained in ALD mode up to 250° C. or higher temperatures and the deposition rate is in the range of 1 to 2 Å per cycle. The obtained film has a low level of impurity (below the detection limit of XPS) and depositions on patterned substrates exhibit a step coverage exceeding 90% in up to 50:1 aspect ratio holes or trenches. When water is replaced by another oxygen source, for instance ozone or oxygen, or even when any of two oxygen sources are supplied together, a good purity of the IGZO films is also obtained.

TABLE 2

| | Existing Ga precursors | Recipe with non-pyrophoric Ga compound | Prophetic example 3 | Prophetic example 6 |
| --- | --- | --- | --- | --- |
| Deposition mode | ALD | ALD | ALD | ALD |
| Products used | $GaEt_3$ | $Ga(NMe_2)_3$ | $(NMe_2)_2Ga(EtNCH_2CH_2NMe_2)$ | $(NMe_2)_2Ga(EtNCH_2CH_2NMe_2)$ |
| | $InMe_3$ | $InMe_3$ | $InMe_3$ | In(iso-Pentyl-Cp) |
| | $ZnEt_2$ | $ZnEt_2$ | $ZnEt_2$ | Diethyl zinc - TEEDA |
| Number of pyrophoric products | 3 | 2 | 2 | 0 |
| Number of solid products | 1 | 2 | 1 | 0 |
| Maximum difference of 1 torr temperature between the three precursors | ~25° C. | ~120° C. | ~90° C. | ~13° C. |
| Max ALD temperature | 200° C. | Not reported | 250° C. | 250° C. |

Table 2 is a comparison between of expected results between a reference process, Prophetic Example 3 and Prophetic Example 5, which shows the advantage of the disclosed gallium precursors over the existing ones. The disclosed gallium precursors are not pyrophoric, which will decrease costs by facilitating the transportation, the storage and the usage. It also allows an increase of the maximum ALD window, which usually allows obtaining films of higher quality. Furthermore, the disclosed gallium precursors are liquid at room temperature, which decreases the cost of the process. Note that tris(dimethylamino)gallium is another standard gallium precursor that may also be used together with trimethyl indium and diethyl zinc. While tris(dimethylamino)gallium is not pyrophoric, tris(dimethylamino)gallium is a solid with a melting point of ~107° C. and a low vapor pressure of 1 torr at 105° C. In that case, the benefit of the disclosed gallium precursors is even higher as the usage of a low vapor pressure solid compound is a real disadvantage for any process being used in mass production. When the indium and zinc precursors are replaced by non-pyrophoric compounds that have similar properties as the gallium molecule, such as in Prophetic example 6, the benefit is even higher in terms of safety and process results.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly, the scope of protection is not limited to the embodiments described herein, but is only limited by the claims which follow, the scope of which shall include all equivalents of the subject matter of the claims.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims. The present invention may suitably comprise, consist or consist essentially of the elements disclosed and may be practiced in the absence of an element not disclosed. Furthermore, if there is language referring to order, such as first and second, it should be understood in an exemplary sense and not in a limiting sense. For example, it can be recognized by those skilled in the art that certain steps can be combined into a single step.

The singular forms "a", "an" and "the" include plural referents, unless the context clearly dictates otherwise.

"Comprising" in a claim is an open transitional term which means the subsequently identified claim elements are a nonexclusive listing i.e. anything else may be additionally included and remain within the scope of "comprising." "Comprising" is defined herein as necessarily encompassing the more limited transitional terms "consisting essentially of" and "consisting of": "comprising" may therefore be replaced by "consisting essentially of" or "consisting of" and remain within the expressly defined scope of "comprising".

"Providing" in a claim is defined to mean furnishing, supplying, making available, or preparing something. The step may be performed by any actor in the absence of express language in the claim to the contrary.

Optional or optionally means that the subsequently described event or circumstances may or may not occur. The description includes instances where the event or circumstance occurs and instances where it does not occur.

Ranges may be expressed herein as from about one particular value, and/or to about another particular value. When such a range is expressed, it is to be understood that another embodiment is from the one particular value and/or to the other particular value, along with all combinations within said range.

All references identified herein are each hereby incorporated by reference into this application in their entireties, as well as for the specific information for which each is cited

What is claimed is:

1. A method of deposition of a gallium-containing oxide film on a substrate, the method comprising the steps of:
   a) exposing the substrate to a vapor of a gallium-containing film-forming composition that contains a gallium precursor and an oxidizer; and
   b) depositing at least part of the gallium precursor onto the substrate to form the gallium-containing oxide film on the substrate through a vapor deposition process,
wherein the gallium precursor has the formula:

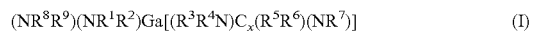

$$(NR^8R^9)(NR^1R^2)Ga[(R^3R^4N)C_x(R^5R^6)(NR^7)] \quad (I)$$

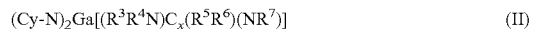

$$(Cy\text{-}N)_2Ga[(R^3R^4N)C_x(R^5R^6)(NR^7)] \quad (II)$$

and the corresponding structures:

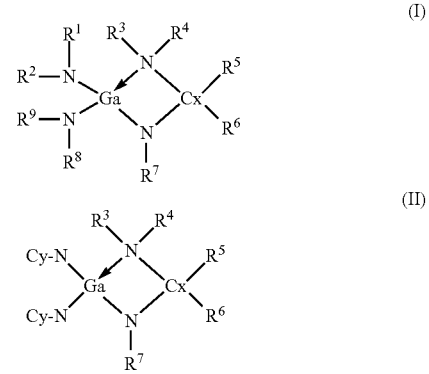

wherein, $R^1$, $R^2$, $R^3$, $R^4$, $R^5$, $R^6$, $R^7$, $R^8$, $R^9$ are independently selected from H, Me, Et, nPr, iPr, nBu, iBu, sBu, or tBu; provided that when $R^1$, $R^2$, $R^3$, $R^4$, $R^8$, $R^9$ each is Me, $R^5$, $R^6$ are not H and $R^7$ is not Me or Et; $R^1$, $R^2$, $R^3$, $R^4$, $R^5$, $R^6$, $R^7$, $R^8$, $R^9$ may be the same or different; x=2, 3, 4; the N-containing rings comprising at least one nitrogen atom and 4-6 carbon atoms in a chain.

2. The method of claim 1, wherein the gallium precursor include $(NMe_2)_2Ga(EtNCH_2CH_2NEt_2)$, $(NEtMe)_2Ga(EtNCH_2CH_2NMe_2)$, $(NEtMe)_2Ga(EtNCH_2CH_2NEt_2)$, $(NEt_2)_2Ga(EtNCH_2CH_2NMe_2)$, and $(NEt_2)_2Ga(EtNCH_2CH_2NEt_2)$.

3. The method of claim 1, wherein x=2.

4. The method of claim 1, further comprising the step of
   a1) at steps a), simultaneously or sequentially, exposing the surface to a vapor of a first metal ($M^1$) precursor, so that at least part of the first metal ($M^1$) precursor and the at least part of the gallium precursor are deposited onto the substrate to form the gallium-containing oxide film on the substrate through the vapor deposition process, wherein the gallium-containing oxide film is a $M^1GaO$ film.

5. The method of claim 4, further comprising the step of
   a2) at steps a1), simultaneously or sequentially, exposing the surface to a vapor of a second metal ($M^2$) precursor, so that at least part of the second metal ($M^2$) precursor, the at least part of the gallium precursor and the at least part of the first metal ($M^1$) precursor are deposited onto the substrate to form the gallium-containing oxide film on the substrate through the vapor deposition process, wherein the gallium-containing oxide film is a $M^1M^2GaO$ film, wherein the first metal ($M^1$) precursor is an indium precursor and the second metal ($M^2$) precursor is a zinc precursor, and vice versa.

6. The method of claim 5, wherein the indium precursor is selected from trialkyl indium, sec-Pentyl-cyclopentadienyl Indium or iso-Pentyl-cyclopentadienyl Indium.

7. The method of claim 5, wherein the zinc precursor is a diethyl zinc derivative selected from diethyl zinc-tetramethylethylenediamine adduct (TMEDA), diethyl zinc-tetraethylethylenediamine adduct (TEEDA), diethyl zinc-N,N'-diethyl-N,N'-diethyl-ethylenediamine adduct, diethyl zinc-N,N-dimethyl-N',N'-diethylethylenediamine adduct, or diethyl zinc-N,N,N'-trimethyl-N'ethylethylenediamine adduct.

8. The method of claim 1, wherein the melting point of the gallium precursor is below approximately 60° C.

9. A method of deposition of a gallium-containing quaternary oxide ($M^1M^2GaO$) film on a substrate, the method comprising the steps of:
a) exposing the substrate to a vapor of a gallium-containing film-forming composition that contains a gallium precursor, a first metal ($M^1$) precursor, a second metal ($M^2$) precursor, and an oxidizer; and
b) depositing at least part of the gallium precursor, at least part of the first metal ($M^1$) precursor and at least part of the second metal ($M^2$) precursor onto the substrate to form the gallium-containing quaternary oxide film ($M^1M^2GaO$) on the substrate through a vapor deposition process,
wherein the gallium precursor has the formula:

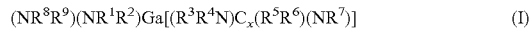

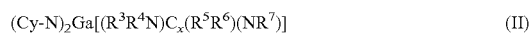

and the corresponding structures:

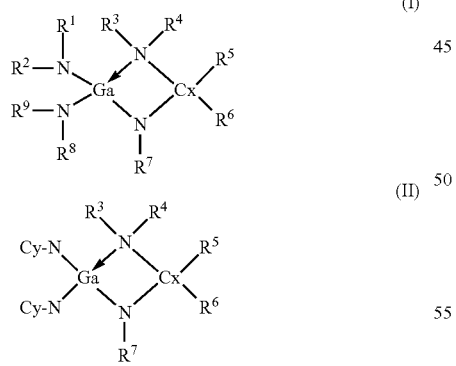

wherein, $R^1$, $R^2$, $R^3$, $R^4$, $R^5$, $R^6$, $R^7$, $R^8$, $R^9$ are independently selected from H, Me, Et, nPr, iPr, nBu, iBu, sBu, or tBu; provided that when $R^1$, $R^2$, $R^3$, $R^4$, $R^8$, $R^9$ each is Me, $R^5$, $R^6$ are not H and $R^7$ is not Me or Et; $R^1$, $R^2$, $R^3$, $R^4$, $R^5$, $R^6$, $R^7$, $R^8$, $R^9$ may be the same or different; x=2, 3, 4; the N-containing rings comprising at least one nitrogen atom and 4-6 carbon atoms in a chain.

10. The method of claim 9, wherein the gallium precursor includes $(NMe_2)_2Ga(EtNCH_2CH_2NEt_2)$, $(NEtMe)_2Ga(EtNCH_2CH_2NMe_2)$, $(NEtMe)_2Ga(EtNCH_2CH_2NEt_2)$, $(NEt_2)_2Ga(EtNCH_2CH_2NMe_2)$, and $(NEt_2)_2Ga(EtNCH_2CH_2NEt_2)$.

11. The method of claim 9, wherein x=2.

12. The method of claim 9, wherein the first metal ($M^1$) precursor is an indium precursor and the second metal ($M^2$) precursor is a zinc precursor, and vice versa.

13. The method of claim 12, wherein the indium precursor is selected from trialkyl indium, sec-Pentyl-cyclopentadienyl Indium or iso-Pentyl-cyclopentadienyl Indium.

14. The method of claim 12, wherein the zinc precursor is a diethyl zinc derivative selected from diethyl zinc-tetramethylethylenediamine adduct (TMEDA), diethyl zinc-tetraethylethylenediamine adduct (TEEDA), diethyl zinc-N,N'-diethyl-N,N'-diethyl-ethylenediamine adduct, diethyl zinc-N,N-dimethyl-N',N'-diethylethylenediamine adduct, or diethyl zinc-N,N,N'-trimethyl-N'ethylethylenediamine adduct.

15. The method of claim 9, wherein the melting point of the Ga precursor is below 60° C.

16. A method of deposition of an Indium Gallium Zinc oxide (IGZO) film on a substrate, the method comprising the steps of:
a) exposing the substrate to a vapor of a gallium-containing film-forming composition that contains a gallium precursor, an indium precursor, a zinc precursor, and $O_3$; and
b) depositing at least part of the gallium precursor, at least part of the indium precursor and at least part of the zinc precursor onto the substrate to form the IGZO film on the substrate through a vapor deposition process,
wherein the gallium precursor has the formula:

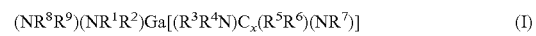

and the corresponding structures:

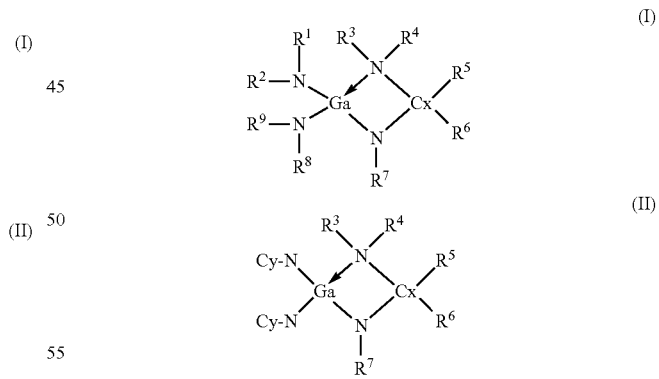

wherein, $R^1$, $R^2$, $R^3$, $R^4$, $R^5$, $R^6$, $R^7$, $R^8$, $R^9$ are independently selected from H, Me, Et, nPr, iPr, nBu, iBu, sBu, or tBu; provided that when $R^1$, $R^2$, $R^3$, $R^4$, $R^8$, $R^9$ each is Me, $R^5$, $R^6$ are not H and $R^7$ is not Me or Et; $R^1$, $R^2$, $R^3$, $R^4$, $R^5$, $R^6$, $R^7$, $R^8$, $R^9$ may be the same or different; x=2, 3, 4; the N-containing rings comprising at least one nitrogen atom and 4-6 carbon atoms in a chain.

17. The method of claim 16, wherein x=2.

18. The method of claim 16, wherein the indium precursor is iso-Pentyl-cyclopentadienyl Indium.

19. The method of claim 16, wherein the zinc precursor is diethyl zinc-tetraethylethylenediamine adduct (TEEDA).

20. The method of claim 16, wherein the melting point of the Ga precursor is below 60° C.

* * * * *